(12) United States Patent
Jang et al.

(10) Patent No.: US 12,100,695 B2
(45) Date of Patent: Sep. 24, 2024

(54) LIGHT EMITTING DEVICE INCLUDING MULTIPLE LIGHT EMITTING PARTS

(71) Applicant: SEOUL VIOSYS CO., LTD., Ansan-si (KR)

(72) Inventors: Jong Min Jang, Ansan-si (KR); Chang Yeon Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/225,643

(22) Filed: Jul. 24, 2023

(65) Prior Publication Data

US 2023/0402571 A1  Dec. 14, 2023

Related U.S. Application Data

(63) Continuation of application No. 17/099,781, filed on Nov. 17, 2020, now Pat. No. 11,749,781, which is a
(Continued)

(51) Int. Cl.
*H01L 25/075* (2006.01)
*H01L 27/15* (2006.01)
(Continued)

(52) U.S. Cl.
CPC ........ *H01L 25/0756* (2013.01); *H01L 27/156* (2013.01); *H01L 33/06* (2013.01);
(Continued)

(58) Field of Classification Search
None
See application file for complete search history.

(56) References Cited

U.S. PATENT DOCUMENTS

| 5,739,552 A * | 4/1998 | Kimura .................. H01L 33/20 257/89 |
| 8,835,948 B2 | 9/2014 | Chang et al. |

(Continued)

FOREIGN PATENT DOCUMENTS

| JP | 07254732 | 10/1995 |
| JP | 2013058729 | 3/2013 |

(Continued)

OTHER PUBLICATIONS

Notice of Allowance dated Aug. 12, 2020 issued to U.S. Appl. No. 16/536,691.

(Continued)

*Primary Examiner* — Scott B Geyer
(74) *Attorney, Agent, or Firm* — Oblon, McClelland, Maier & Neustadt, L.L.P.

(57) ABSTRACT

A light emitting device including a first light emitting part including a first n-type semiconductor layer, a first active layer, a first p-type semiconductor layer, and a first transparent electrode, a second light emitting part disposed over the first light emitting part and including a second n-type semiconductor layer, a second active layer, a second p-type semiconductor layer, and a second transparent electrode, and a third light emitting part disposed over the second light emitting part and including a third n-type semiconductor layer, a third active layer, a third p-type semiconductor layer, and a third transparent electrode, in which the light emitting device has substantially a quadrangular shape when viewed from the top, and has first to fourth corners.

20 Claims, 22 Drawing Sheets

Related U.S. Application Data continuation of application No. 16/536,691, filed on Aug. 9, 2019, now Pat. No. 10,862,006.

(60) Provisional application No. 62/764,959, filed on Aug. 17, 2018.

(51) Int. Cl.
*H01L 33/06* (2010.01)
*H01L 33/08* (2010.01)
*H01L 33/14* (2010.01)
*H01L 33/38* (2010.01)

(52) U.S. Cl.
CPC .............. *H01L 33/08* (2013.01); *H01L 33/14* (2013.01); *H01L 33/382* (2013.01); *H01L 33/387* (2013.01)

(56) References Cited

U.S. PATENT DOCUMENTS

| | | | |
|---|---|---|---|
| 10,686,099 B2 | 6/2020 | Huppmann et al. | |
| 11,527,519 B2 | 12/2022 | Chae et al. | |
| 2003/0047742 A1 | 3/2003 | Hen | |
| 2006/0027820 A1 | 2/2006 | Cao | |
| 2006/0255343 A1 | 11/2006 | Ogihara et al. | |
| 2007/0069220 A1* | 3/2007 | Ogihara | H01L 25/0756 257/E33.072 |
| 2007/0120129 A1* | 5/2007 | DenBaars | H01L 33/30 257/E33.068 |
| 2007/0158659 A1* | 7/2007 | Bensce | H01L 31/11 257/79 |
| 2010/0051975 A1* | 3/2010 | Suzuki | H01L 25/0756 257/E33.056 |
| 2011/0175121 A1 | 7/2011 | Gmeinwieser et al. | |
| 2011/0299074 A1* | 12/2011 | Kim | H01L 31/035281 250/208.2 |
| 2012/0228589 A1* | 9/2012 | Mitsuya | H10K 50/19 257/E51.026 |
| 2012/0305959 A1 | 12/2012 | Yu et al. | |
| 2013/0056785 A1 | 3/2013 | Hwang | |
| 2013/0264588 A1* | 10/2013 | Liu | H01L 25/075 438/27 |
| 2013/0270514 A1 | 10/2013 | Saxler | |
| 2013/0277692 A1 | 10/2013 | Chang et al. | |
| 2013/0285010 A1 | 10/2013 | Lu | |
| 2014/0070261 A1 | 3/2014 | Lu et al. | |
| 2014/0339580 A1* | 11/2014 | Park | H01L 33/08 257/90 |
| 2015/0001561 A1 | 1/2015 | Katsuno et al. | |
| 2015/0001572 A1* | 1/2015 | Katsuno | H01L 33/387 257/99 |
| 2015/0325555 A1 | 11/2015 | Hashimoto et al. | |
| 2015/0340348 A1 | 11/2015 | Katsuno et al. | |
| 2016/0336482 A1 | 11/2016 | Lu et al. | |
| 2017/0288093 A1 | 10/2017 | Cha et al. | |
| 2018/0151632 A1* | 5/2018 | Kang | H01L 24/26 |
| 2019/0097088 A1 | 3/2019 | Huppmann et al. | |
| 2019/0157508 A1 | 5/2019 | Choi et al. | |
| 2019/0181181 A1 | 6/2019 | Yeon et al. | |
| 2019/0198565 A1 | 6/2019 | Lee et al. | |
| 2019/0229234 A1* | 7/2019 | Zou | H01L 33/42 |
| 2020/0212017 A1* | 7/2020 | Oh | H01L 33/62 |
| 2020/0335663 A1* | 10/2020 | Mughal | H01L 33/06 |

FOREIGN PATENT DOCUMENTS

| | | |
|---|---|---|
| JP | 2015012044 | 1/2015 |
| KR | 20150003676 | 1/2015 |
| KR | 20160123621 | 10/2016 |
| WO | 2017153123 | 9/2017 |

OTHER PUBLICATIONS

Non-Final Office Action dated Jan. 11, 2023 issued to U.S. Appl. No. 17/099,781.
Notice of Allowance dated Apr. 27, 2023 issued to U.S. Appl. No. 17/099,781.
Corrected Notice of Allowance dated May 23, 2023 issued to U.S. Appl. No. 17/099,781.

* cited by examiner

LIGHT EMITTING DEVICE INCLUDING MULTIPLE LIGHT EMITTING PARTS

CROSS-REFERENCE TO RELATED APPLICATIONS

This application is a Continuation of U.S. patent application Ser. No. 17/099,781, filed Nov. 17, 2020, which is a Continuation of U.S. patent application Ser. No. 16/536,691 filed on Aug. 9, 2019, now issued as U.S. Pat. No. 10,862,006, which claims priority from and the benefit of U.S. Provisional Patent Application No. 62/764,959, filed on Aug. 17, 2018, each of which is hereby incorporated by reference for all purposes as if fully set forth herein.

BACKGROUND

Field

Exemplary embodiments of the present disclosure relate to a light emitting device, and more particularly, to a light emitting device including a plurality of stacked light emitting layers.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and quicker response speed that conventional light sources.

A display device typically displays various colors by utilizing mixed colors of blue, green, and red. Each pixel of a display device may include blue, green, and red sub-pixels, and the color of a particular pixel may be determined through the colors of the sub-pixels, and an image may be displayed by a combination of pixels.

Light emitting diodes have been mainly used as backlight sources in display devices. However, recently, a micro LED display has been developed as a next generation display, which directly displays images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention have light, thin, and compact characteristics.

Additional features of the inventive concepts will be set forth in the description which follows, and in part will be apparent from the description, or may be learned by practice of the inventive concepts.

A light emitting device according to an exemplary embodiment includes a first light emitting part including a first n-type semiconductor layer, a first active layer, a first p-type semiconductor layer, and a first transparent electrode, a second light emitting part disposed over the first light emitting part and including a second n-type semiconductor layer, a second active layer, a second p-type semiconductor layer, and a second transparent electrode, a third light emitting part disposed over the second light emitting part and including a third n-type semiconductor layer, a third active layer, a third p-type semiconductor layer, and a third transparent electrode, a first adhesion layer disposed between the first and second light emitting parts and including first coupling patterns that are adhesive and conductive, and a second adhesion layer disposed between the second and third light emitting parts and including second coupling patterns that are adhesive and conductive, in which the third light emitting part has a mesa structure exposing a portion of the second coupling patterns of the second adhesion layer.

The light emitting device may further include a common electrode pad electrically connected to the first, second, and third transparent electrodes, a first electrode pad electrically connected to the first n-type semiconductor layer, a second electrode pad electrically connected to the second n-type semiconductor layer, and a third electrode pad disposed at one corner of the light emitting device and electrically connected to the third n-type semiconductor layer.

Each of the first and second light emitting parts may have a substantially quadrangular shape including first, second, third, and fourth corners respectively corresponding to first, second, third, and fourth corners of the light emitting device, and the third light emitting part may have a substantially quadrangular shape, the third light emitting part having cut portions in areas that correspond to the second and third corners of the light emitting device.

The second coupling patterns may be exposed by the third light emitting part in areas that correspond to the second and third corners of the light emitting device.

The first electrode pad may be disposed between a first outer sidewall of the third light emitting part and an outer sidewall of the second light emitting part, and the second electrode pad may be disposed between a second outer sidewall of the third light emitting part and a second outer sidewall of the second light emitting part.

A length of the third light emitting part between the cut portions may be shorter than a length of the third light emitting part between two opposing corners of the third light emitting part that correspond to the first and fourth corners of the light emitting device.

The light emitting device may further include a first through structure electrically coupling the first, second, and third transparent electrodes with the common electrode pad, a second through structure electrically coupling the first n-type semiconductor layer and the first electrode pad, and a third through structure electrically coupling the second n-type semiconductor layer and the second electrode pad.

The first through structure may include a first through pattern electrically coupling the first transparent electrode and the first coupling pattern, a second through pattern electrically coupling the second transparent electrode and the second coupling pattern, and a third through pattern electrically coupling the third transparent electrode and the common electrode pad.

The first through structure may further include a fourth through pattern electrically coupling the second coupling pattern and the third transparent electrode, the second coupling pattern may be disposed between the second and fourth through patterns to electrically couples the second and fourth through patterns, and the first coupling pattern may be disposed between the first through pattern and the second transparent electrode to electrically couple the first through pattern and the second transparent electrode.

The light emitting device may further include a first insulation layer surrounding an outer sidewall of the second through pattern and extending onto the second n-type semiconductor layer, and a second insulation layer surrounding an outer sidewall of the third through pattern.

The first through pattern may include an upper portion wider than a lower portion thereof, and the first coupling pattern may be connected to the upper portion.

The second through structure may include a first through pattern electrically coupling the first n-type semiconductor layer and a first coupling pattern, a second through pattern electrically coupling the first coupling pattern and a second coupling pattern, and a third through pattern electrically coupling the second coupling pattern and the first electrode pad.

The third through pattern may be disposed between an outer sidewall of the second light emitting part and an outer sidewall of the third light emitting part.

The light emitting device may further include a passivation layer disposed over the second coupling pattern and surrounding the third through pattern, and having a top surface which is coplanar with a top surface of the third n-type semiconductor layer.

The first coupling pattern may include an extension extended toward an outside of the first through pattern, and the second through pattern may be connected to the extension of the first coupling pattern.

A first vertical central axis crossing a center of the first through pattern may be laterally spaced apart from a second vertical central axis crossing a center of the second through pattern.

The third through structure may include a first through pattern electrically coupling the third n-type semiconductor layer and a second coupling pattern, and a second through pattern electrically coupling the second coupling pattern and the second electrode pad.

The second through pattern may be disposed between an outer sidewall of the third light emitting part and an outer sidewall of the second light emitting part.

The light emitting device may further include a passivation layer surrounding the second through pattern over the second coupling pattern and having a top surface which is coplanar with a top surface of the third n-type semiconductor layer.

The first coupling pattern may be disposed at the same elevation as the first adhesion layer, and the second coupling pattern may be disposed at the same elevation as the second adhesion layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1A:
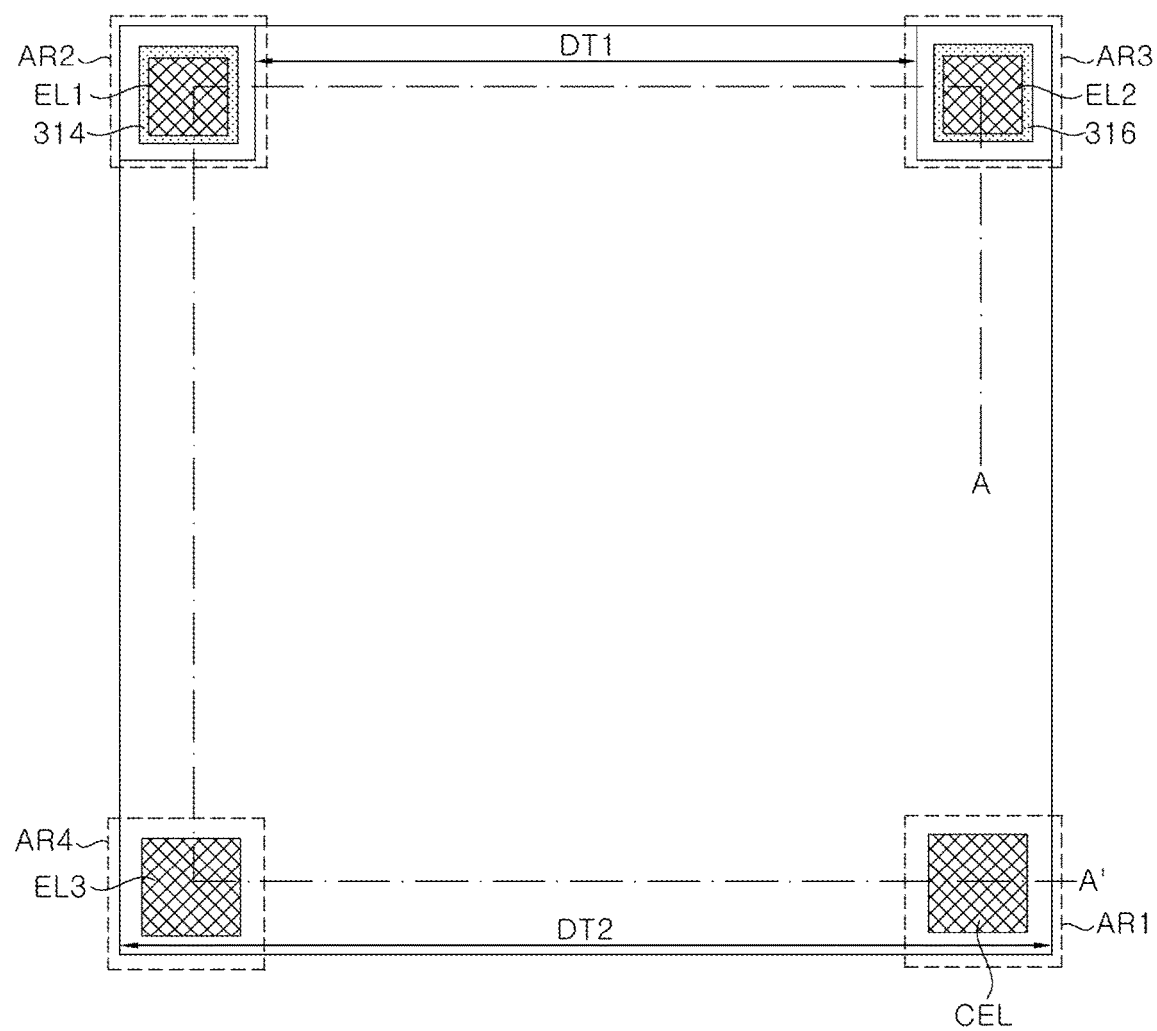
FIGS. 1A and 1B are top views of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a light emitting device will be described below with reference to the accompanying drawings through various exemplary embodiments.

Figure 1B:
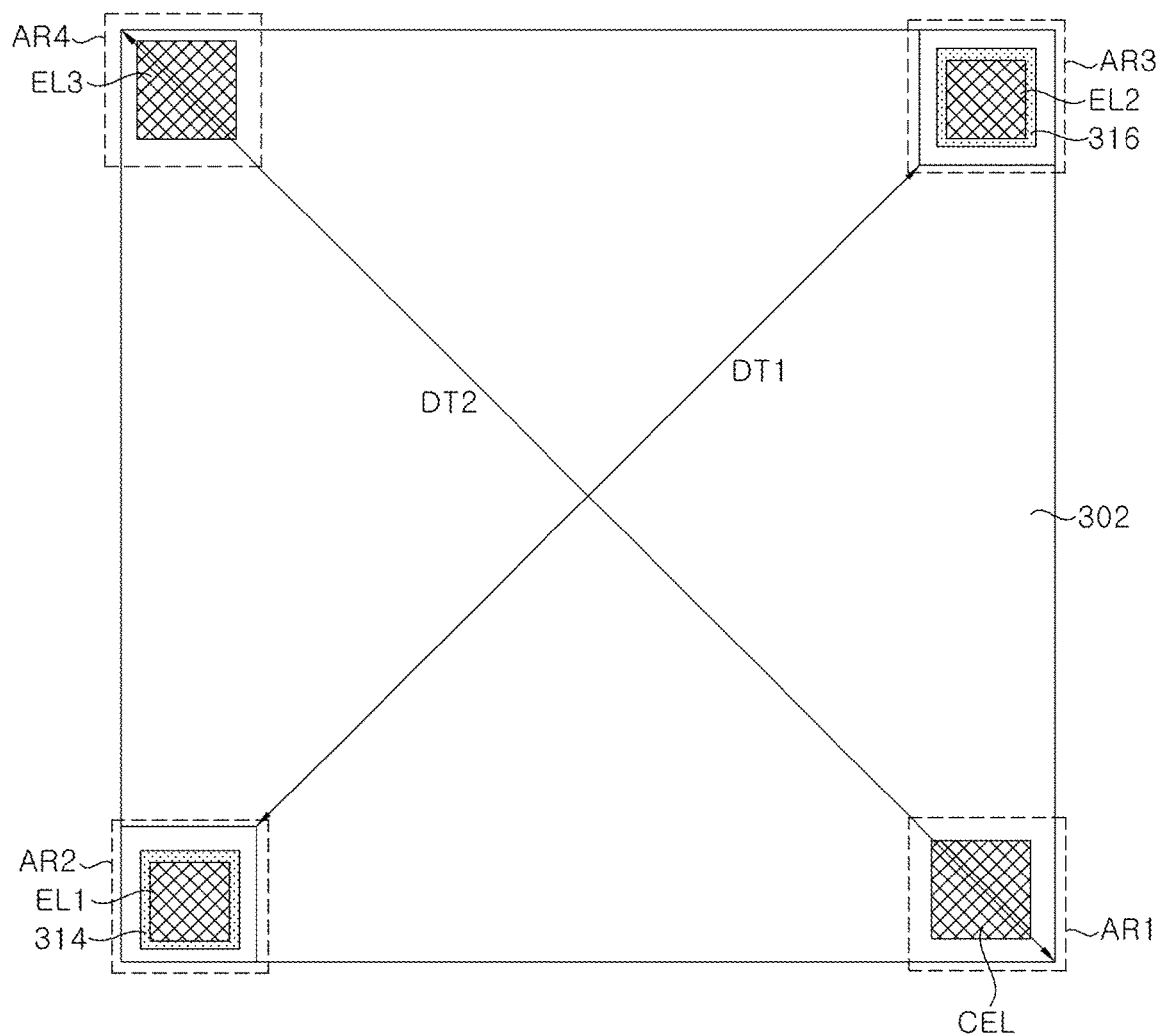
Figure 1C:
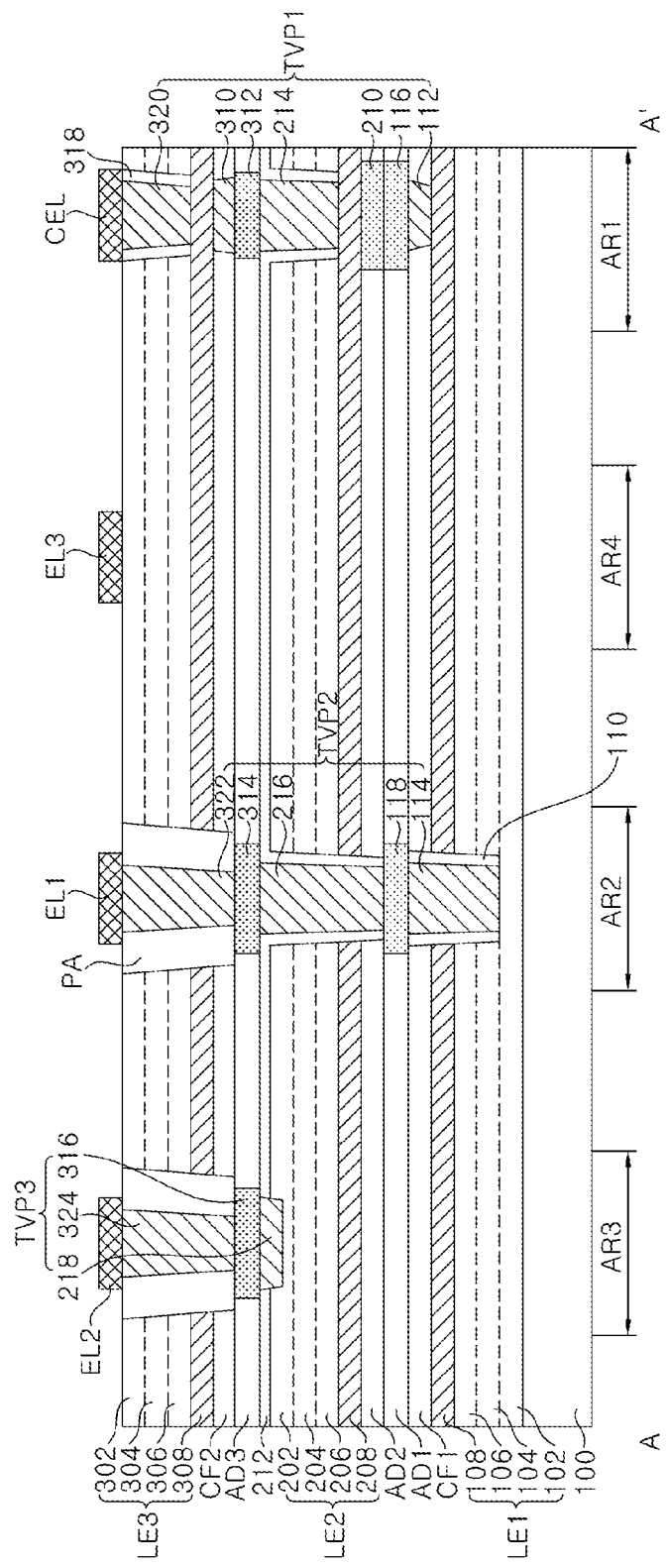
FIGS. 1C and 1D are cross-sectional views taken along line A-A' of the light emitting device of FIG. 1A according to exemplary embodiments.

FIGS. 1A and 1B are top views of light emitting devices according to an exemplary embodiment, and FIG. 1C is a cross-sectional views taken along line A-A' of the light emitting device of FIG. 1A.

Referring to FIGS. 1A through 1C, a light emitting device may include a first light emitting part LE1, a second light emitting part LE2, and a third light emitting part LE3, which are vertically stacked on a substrate 100.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$) or silicon. In some exemplary embodiments, the substrate 100 may be a patterned sapphire substrate.

One surface of the substrate 100 may be brought into contact with the first light emitting part LE1, and the other surface facing away the one surface may be the light extraction surface of the light emitting device. In some exemplary embodiments, the substrate 100 may be removed. In this case, one surface of the first light emitting part LE1, which faces the substrate 100, may be the light extraction surface of the light emitting device. When the light extraction surface is the other surface of the substrate 100 or one surface of the first light emitting part LE1, the wavelength of light emitted from the first light emitting part LE1 may be the shortest, the wavelength of light emitted from the second light emitting part LE2 may be longer than the wavelength of the first light emitting part LE1 and shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light. However, the inventive concepts are not limited thereto. In some exemplary embodiments, for example, the first light emitting part LE1 may emit light having a wavelength longer than that of the second light emitting part LE2 or the third light emitting part LE3, and the second light emitting part LE2 may emit light having a wavelength longer than that of the third light emitting part LE3. For example, the first light emitting part LE1 may emit green light, the second light emitting part LE2 may emit blue light, and the third light emitting part LE3 may emit red light.

The substrate 100 may have a substantially quadrangular structure when viewed from the top. Hereinafter, the respective corners of the substantially quadrangular structure may be referred to as a first area AR1, a second area AR2, a third area AR3, and a fourth area AR4. The first light emitting part LE1 and the second light emitting part LE2 may have substantially the same size of light emitting area and similar stack structure, and the third light emitting part LE3 may have a light emitting area having a size smaller than that of the first light emitting part LE1 or the second light emitting part LE2. More particularly, the third light emitting part LE3 may have a mesa structure, in which the corner of each of the second area AR2 and the third area AR3 is etched. As the third light emitting part has the mesa structure, in which each of the second area AR2 and the third area AR3 is cut (e.g., cut portions), the light emitting area of the third light emitting part LE3 may be smaller than that of the light emitting area of the first light emitting part LE1 or the second light emitting part LE2 when viewed from the top. The etched side surface of the third light emitting part LE3 may be an inclined side surface.

According to the illustrated exemplary embodiment shown in FIG. 1A, in the third light emitting part LE3, the second area AR2 and the third area AR3 may be neighboring corners. A length DT1 of the third light emitting part LE3 between the second area AR2 and the third area AR3 may be shorter than a length DT2 of the third light emitting part LE3 including the first area AR1 and the fourth area AR4. The length DT1 between the second area AR2 and the third area AR3, and the length DT2 including the first area AR1 and the fourth area AR4 may be defined as shortest distances.

According to another exemplary embodiment shown in FIG. 1B, in the third light emitting part LE3, the second area AR2 and the third area AR3 may be opposite corners. A length DT1 of the third light emitting part LE3 between the second area AR2 and the third area AR3 may be shorter than a diagonal length DT2 of the third light emitting part LE3 including the first area AR1 and the fourth area AR4. The length DT1 between the second area AR2 and the third area AR3 and the length DT2 including the first area AR1 and the fourth area AR4 may be defined as shortest distances.

According to an exemplary embodiment, in the second area AR2 and the third area AR3, the outer sidewall of the third light emitting part LE3 may be disposed inwardly with respect to the outer sidewall of the second light emitting part LE2. More particularly, in the second area AR2 and the third area AR3, a fifth coupling pattern 314 and a sixth coupling pattern 316, which will be described later, may be exposed by the outer sidewall of the third light emitting part LE3.

The first light emitting part LE1 may include a first n-type semiconductor layer 102, a first active layer 104, a first p-type semiconductor layer 106, and a first transparent electrode 108, which are vertically stacked. The second light emitting part LE2 may include a second transparent electrode 208, a second p-type semiconductor layer 206, a second active layer 204, and a second n-type semiconductor layer 202, which are sequentially stacked. The third light emitting part LE3 may include a third transparent electrode 308, a third p-type semiconductor layer 306, a third active layer 304, and a third n-type semiconductor layer 302, which are sequentially stacked.

According to an exemplary embodiment, each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. Each of the first transparent electrode 108, the second transparent electrode 208, and the third transparent electrode 308 may include a transparent oxide layer, such as a zinc oxide (ZnO), indium tin oxide (ITO), zinc-doped indium tin oxide (ZITO), zinc indium oxide (ZIO), gallium indium oxide (GIO), zinc tin oxide (TEO), fluorine-doped tin oxide (FTO), gallium doped zinc oxide (GZO), aluminum-doped zinc oxide (AZO), or others.

The light emitting device may further include a common electrode pad CEL, a first electrode pad EL1, a second electrode pad EL2, and a third electrode pad EL3, which are disposed on the third light emitting part LE3.

The common electrode pad CEL may be electrically coupled with the first p-type semiconductor layer 106 of the first light emitting part LE1, the second p-type semiconductor layer 206 of the second light emitting part LE2, and the third p-type semiconductor layer 306 of the third light emitting part LE3 in the first area AR1. The first electrode pad EL1 may be electrically coupled with the first n-type semiconductor layer 102 of the first light emitting part LE1 in the second area AR2. The second electrode pad EL2 may be electrically coupled with the second n-type semiconductor layer 202 of the second light emitting part LE2 in the third area AR3. The third electrode pad EL3 may be electrically coupled with the third n-type semiconductor layer 302 of the third light emitting part LE3 in the fourth area AR4.

Alternatively, the common electrode pad CEL of the first area AR1 may be electrically coupled with the first n-type semiconductor layer 102 of the first light emitting part LE1, the second n-type semiconductor layer 202 of the second light emitting part LE2, and the third n-type semiconductor layer 302 of the third light emitting part LE3. The first electrode pad EL1 in the second area AR2 may be electrically coupled with the first p-type semiconductor layer 106 of the first light emitting part LE1, the second electrode pad EL2 in the third area AR3 may be electrically coupled with the second p-type semiconductor layer 206 of the second light emitting part LE2, and the third electrode pad EL3 in the fourth area AR4 may be electrically coupled with the third p-type semiconductor layer 306 of the third light emitting part LE3.

On the third light emitting part LE3, a passivation layer PA covering portions where the corner of the second area AR2 and the corner of the third area AR3 in the third light emitting part LE3 are respectively removed may be additionally provided. The passivation layer PA may include one of $SiO_2$, $Al_2O_3$, $Si_3N_4$, SOG (silicon on glass), epoxy, polyimide, SUB, or BCB (benzo cyclo butene). More particularly, the passivation layer may include an oxide layer or nitride layer including Si.

In an exemplary embodiment, the light emitting device may further include a first color filter CF1, a first adhesion layer AD1, and a second adhesion layer AD2, which are disposed between the first light emitting part LE1 and the second light emitting part LE2, and a second color filter CF2 and a third adhesion layer AD3, which are disposed between the second light emitting part LE2 and the third light emitting part LE3. In some exemplary embodiments, the first color filter CF2 and the second color filter CF2 can be omitted. The first color filter CF1 may be disposed adjacent to the first transparent electrode 108 of the first light emitting part LE1, and the first adhesion layer AD1 may be disposed on the first color filter CF1. The first adhesion layer AD1 may be bonded with the second adhesion layer AD2 to bond the first light emitting part LE1 and the second light emitting part LE2 to each other. Further, the second color filter CF2 may be disposed adjacent to the third transparent electrode 308 of the third light emitting part LE3, and the third adhesion layer AD3 may bond the second light emitting part LE2 and the second color filter CF2 to bond the second light emitting part LE2 and the third light emitting part LE3 to each other. In some exemplary embodiments, a fourth adhesion layer may be additionally provided between the second color filter CF2 and the third adhesion layer AD3.

Each of the first color filter CF1 and the second color filter CF2 may include a DBR (distributed Bragg reflector), in which $TiO_2$ and $SiO_2$ are alternately stacked. For example, the first color filter CF1 and the second color filter CF2 may be different in the composition ratio and alternate stacking order and number of $TiO_2$ and $SiO_2$. Each of the first adhesion layer AD1 and the second adhesion layer AD2 may be an insulative and transparent adhesion layer, and include, for example, SOG (silicon on glass), epoxy, polyimide, SUB, or BCB.

The light emitting device may further include a first through structure TVP1, which electrically couples the first transparent electrode 108, the second transparent electrode 208, and the third transparent electrode 308 with the common electrode pad CEL. Hereinafter, 'first,' 'second,' 'seventh,' 'eighth', and 'ninth' are simply used as ordinal numbers for distinguishing patterns, and description order thereof may not be sequentially.

The first through structure TVP1 may include through patterns 112, 214, 310, and 320, which pass through the first light emitting part LE1, the second light emitting part LE2, and the third light emitting part LE3, and electrically couple the first transparent electrode 108, the second transparent electrode 208, and the third transparent electrode 308, and coupling patterns 116, 210, and 312, which pass through the first adhesion layer AD1, the second adhesion layer AD2, and the third adhesion layer AD3, and are electrically coupled directly or indirectly through the through patterns 112, 214, 310, and 320 with the first transparent electrode 108, the second transparent electrode 208, and the third transparent electrode 308.

According to an exemplary embodiment, the first through structure TVP1 may include a first through pattern 112, which passes through the first color filter CF1 and is brought into electrical contact with the first transparent electrode 108, a first coupling pattern 116 and a third coupling pattern 210, which pass through the first adhesion layer AD1 and the second adhesion layer AD2 are brought into electrical contact with the first through pattern 112 and the second transparent electrode 208, a third through pattern 214, which passes through the second p-type semiconductor layer 206, the second active layer 204, and the second n-type semiconductor layer 202 and is brought into electrical contact with the second transparent electrode 208, a fourth coupling pattern 312, which passes through the third adhesion layer AD3 and is brought into electrical contact with the third through pattern 214, a sixth through pattern 310, which passes through the second color filter CF2 and is brought into electrical contact with the fourth coupling pattern 312 and the third transparent electrode 308, and a seventh through pattern 320, which passes through the third p-type semiconductor layer 306, the third active layer 304, and the third n-type semiconductor layer 302 and is brought into electrical contact with the third transparent electrode 308 and the common electrode pad CEL. According to an exemplary embodiment, the first color filter CF1 may surround the outer sidewall of the first through pattern 112. The second color filter CF2 may surround the outer sidewall of the sixth through pattern 310.

Each of the first through pattern 112, the third through pattern 214, the sixth through pattern 310, and the seventh through pattern 320 of the first through structure TVP1 may include at least one of Ti, Ni, Au, Cr, Cu, TiW, or Mo. Each of the first coupling pattern 116, the third coupling pattern 210, and the fourth coupling pattern 312 of the first through structure TVP1 may include metal having low melting temperature, such as Sn or In, which also has an adhesion property and an electrical conductivity. When the first coupling pattern 116 and the third coupling pattern 210 include substantially the same material, the first coupling pattern 116 and the third coupling pattern 210 may not be distinguished from each other. Each of the first through pattern 112, the third through pattern 214, and the seventh through pattern 320 may have an inclined side surface such that a width thereof gradually decreases in a downward direction. The sixth through pattern 310 may have an inclined side surface such that a width thereof gradually increases in the downward direction.

According to an exemplary embodiment, one surface of the first through pattern 112 is brought into electrical contact with the first transparent electrode 108, and the other surface of the first through pattern 112 may be electrically coupled with the second transparent electrode 208 through the first coupling pattern 116 and the third coupling pattern 210. The second transparent electrode 208 may be brought into electrical contact with one surface of the third through pattern 214, and the other surface of the third through pattern 214 may be brought into electrical contact with the fourth coupling pattern 312. The fourth coupling pattern 312 may be electrically coupled with one surface of the third transparent electrode 308 through the sixth through pattern 310. The other surface of the third transparent electrode 308 may be brought into electrical contact with the common electrode pad CEL by the seventh through pattern 320. In this case, the first transparent electrode 108, the second transparent electrode 208, and the third transparent electrode 308 may not be etched, and may be electrically coupled with one another through the through patterns and the coupling patterns, which pass through the first light emitting part LE1, the first adhesion layer AD1, the second adhesion layer AD2, the second light emitting part LE2, the third adhesion layer AD3, and the third light emitting part LE3. In this manner, since contact areas through which the first transparent electrode 108, the second transparent electrode 208, and the third transparent electrode 308 are brought into contact with the through patterns 112, 214, 310, and 320, or the coupling patterns 116, 210, and 312 may be increased, the electrical reliability of the light emitting device may be improved.

In the first through structure TVP1, the first through pattern 112 may be disposed to be aligned with the first transparent electrode 108 in the first area AR1, and the first coupling pattern 116 may be disposed to be aligned with the first through pattern 112. The third through pattern 214 may be disposed to be aligned with the second transparent electrode 208 in the first area AR1, and be aligned with the first coupling pattern 116 in the first area AR1. The fourth coupling pattern 312 may be disposed to be aligned with the third through pattern 214, and the sixth through pattern 310 may be disposed to be aligned with the fourth coupling pattern 312. The seventh through pattern 320 may be disposed to be aligned with the third transparent electrode 308 in the first area AR1, and be aligned with a position where the common electrode pad CEL is to be formed.

The light emitting device may further include a second insulation layer 212, which is surrounds the outer sidewall of the third through pattern 214. The second insulation layer 212 may insulate the second n-type semiconductor layer 202, the second active layer 204, and the second p-type semiconductor layer 206 from the third through pattern 214. The second insulation layer 212 may include, for example, $SiO_2$ or $Si_3N_4$, which has high light transmittance and an electrical insulation property. The second insulation layer 212 may extend onto the second n-type semiconductor layer 202 as shown in the drawings, however, in some exemplary embodiments, the second insulation layer 212 may surround only the outer sidewall of the third through pattern 214.

The light emitting device may further include a third insulation layer 318, which surrounds the outer sidewall of the seventh through pattern 320. The third insulation layer 318 may insulate the third n-type semiconductor layer 302, the third active layer 304, and the third p-type semiconductor layer 306 from the seventh through pattern 320. The third insulation layer 318 may include, for example, $SiO_2$ or $Si_3N_4$, which have high light transmittance and an electrical insulation property. While the third insulation layer 318 is illustrated as surrounding only the outer sidewall of the seventh through pattern 320, however, in some exemplary embodiments, the third insulation layer 318 may extend onto the third n-type semiconductor layer 302.

The light emitting device may further include a second through structure TVP2, which is electrically coupled with the first n-type semiconductor layer 102 in the second area AR2.

The second through structure TVP2 may include through patterns 114, 216, and 322, which are electrically coupled with the first n-type semiconductor layer 102 of the first light emitting part LE1 and pass through the first light emitting part LE1, the second light emitting part LE2, the third light emitting part LE3, the first adhesion layer AD1, the second adhesion layer AD2, and the third adhesion layer AD3. The second through structure TVP2 may further include coupling patterns 118 and 314, which are electrically coupled with the through patterns 114, 216, and 322.

According to an exemplary embodiment, the second through structure TVP2 may include a second through pattern 114, which passes through the first active layer 104, the first p-type semiconductor layer 106, the first transparent electrode 108, and the first color filter CF1 and is brought into electrical contact with the first n-type semiconductor layer 102, a second coupling pattern 118, which passes through the first adhesion layer AD1 and is brought into electrical contact with the second through pattern 114, a fourth through pattern 216, which passes through the second adhesion layer AD2, the second transparent electrode 208, the second p-type semiconductor layer 206, the second active layer 204, and the second n-type semiconductor layer 202 and is brought into electrical contact with the second coupling pattern 118, a fifth coupling pattern 314, which passes through the third adhesion layer AD3 and is brought into electrical contact with the fourth through pattern 216, and an eighth through pattern 322, which passes through the third transparent electrode 308, the third p-type semiconductor layer 306, the third active layer 304, the third n-type semiconductor layer 302, and the passivation layer PA and is brought into electrical contact with the fifth coupling pattern 314 and the first electrode pad ELL According to an exemplary embodiment, in the second area AR2, the eighth through pattern 322 may be disposed between the outer sidewall of the third light emitting part LE3 and the outer sidewall of the second light emitting part LE2. The first color filter CF1 may surround the outer sidewall of the second through pattern 114.

Each of the second through pattern 114, the fourth through pattern 216, and the eighth through pattern 322 of the second through structure TVP2 may include at least one of Ti, Ni, Au, Cr, Cu, TiW or Mo. Each of the second coupling pattern 118 and the fifth coupling pattern 314 of the second through structure TVP2 may include metal having low melting temperature, such as Sn or In, which also has an adhesion property and an electrical conductivity.

Figure 1D:
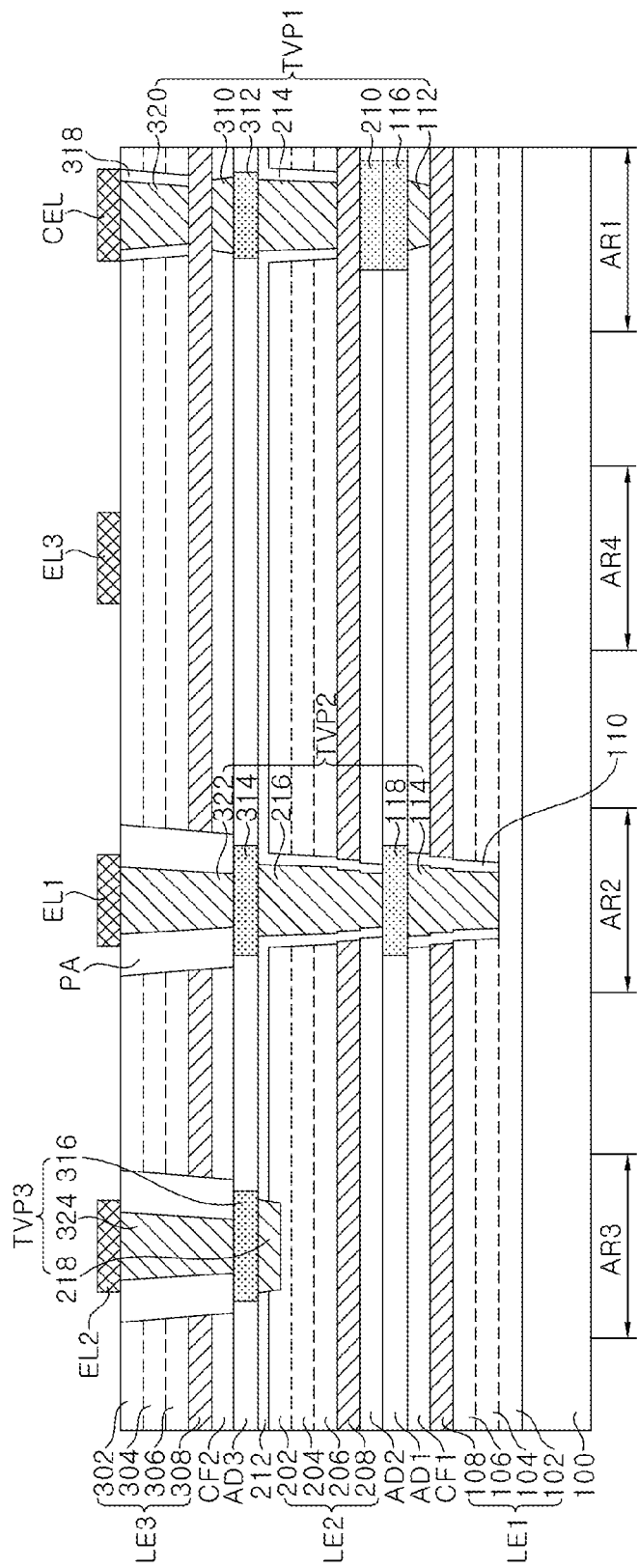

In the second through structure TVP2, the second through pattern 114 may be aligned with the first n-type semiconductor layer 102 in the second area AR2, and the second coupling pattern 118 may be aligned with the second through pattern 114. The fourth through pattern 216 may be aligned with the second coupling pattern 118, and the fifth coupling pattern 314 may be aligned with the fourth through pattern 216. The eighth through pattern 322 may be disposed to be aligned with the fifth coupling pattern 314 and the first electrode pad ELL According to another exemplary embodiment, as shown in FIG. 1C, each of the second through pattern 114, the fourth through pattern 216, and the eighth through pattern 322 of the second through structure TVP2 may have an inclined side surface such that a width thereof gradually decreases in the downward direction. According to the exemplary embodiment shown in FIG. 1D, each of the second through pattern 114, the fourth through pattern 216, and the eighth through pattern 322 of the second through structure TVP2 may have a stepped side surface, such that a width thereof decreases in the downward direction. For example, the second through pattern 114 may include a first portion, which passes through the first active layer 104 and the first p-type semiconductor layer 106, a second portion which has a width greater than the first portion and passes through the first transparent electrode 108, and a third portion which has a width greater than the second portion and passes through the first color filter CF1. The fourth through pattern 216 may include a first portion disposed in the second adhesion layer AD2, a second portion which has a width greater than the first portion and passes through the second transparent electrode 208, and a third portion which has a width greater than the second portion and passes through the second p-type semiconductor layer 206, the second active layer 204, and the second n-type semiconductor layer 202. Each of the second through pattern 114, the fourth through pattern 216, and the eighth through pattern 322 may be formed to have a side surface with a stepped structure, because since layers formed of different components are etched, the etching selectivity of the layers formed of the different components may be different depending on the type of an etching process or an etchant.

The light emitting device may further include a first insulation layer 110, which surrounds the outer sidewall of the second through pattern 114. The first insulation layer 110 may insulate the second through pattern 114 from the first active layer 104, the first p-type semiconductor layer 106, and the first transparent electrode 108. In some exemplary embodiments, the first insulation layer 110 may extend onto the first color filter CF1 and surround the side surface of the first through pattern 112. In this case, since the first color filter CF1 includes an insulation material, the first insulation layer 110 may not surround the side surface of the first through pattern 112. The first insulation layer 110 may include, for example, $SiO_2$, $Al_2O_3$, $Si_3N_4$, or others, which has high light transmittance and an electrical insulation property. Also, the second insulation layer 212 may surround the outer sidewall of the third through pattern 214 in the first area AR1, extend on the second n-type semiconductor layer 202, and surround the outer sidewall of the fourth through pattern 216 in the second area AR2.

The light emitting device may further include a third through structure TVP3, which is electrically coupled with the second n-type semiconductor layer 202 in the third area AR3.

The third through structure TVP3 may include through patterns 218 and 324, which are electrically coupled with the second n-type semiconductor layer 202 of the second light emitting part LE2 and pass through the third light emitting part LE3 and a portion of the second light emitting part LE2, and a sixth coupling pattern 316 which passes through the third adhesion layer AD3 bonding the second light emitting part LE2 and the third light emitting part LE3 and is electrically coupled with the through patterns 218 and 324.

According to an exemplary embodiment, the third through structure TVP3 may include a fifth through pattern 218 which is brought into electrical contact with the second n-type semiconductor layer 202, the sixth coupling pattern 316 which is brought into electrical contact with the fifth through pattern 218 and passes through the third adhesion layer AD3, and a ninth through pattern 324 which passes through the third transparent electrode 308, the third p-type semiconductor layer 306, the third active layer 304, the third n-type semiconductor layer 302, and the passivation layer PA and is brought into electrical contact with the sixth coupling pattern 316 and the second electrode pad EL2. According to an exemplary embodiment, in the third area AR3, the ninth through pattern 324 may be disposed between the outer sidewall of the third light emitting part LE3 and the outer sidewall of the second light emitting part LE2.

Each of the fifth through pattern 218 and the ninth through pattern 324 of the third through structure TVP3 may include at least one of Ti, Ni, Au, Cr, Cu, TiW, or Mo. The sixth coupling pattern 316 of the third through structure TVP3 may include metal having low melting temperature, such as Sn or In, which also has an adhesion property and an electrical conductivity. Each of the fifth through pattern 218 and the ninth through pattern 324 may have a inclined side surface such that a width thereof gradually decreases in the downward direction.

In the third through structure TVP3, the fifth through pattern 218 may be aligned with the second n-type semiconductor layer 202 in the third area AR3, and the sixth coupling pattern 316 may be aligned with the fifth through pattern 218. The ninth through pattern 324 may be disposed to be aligned with the sixth coupling pattern 316 and the second electrode pad EL2.

The second insulation layer 212 may surround the outer sidewall of the third through pattern 214 in the first area AR1, surround the outer sidewall of the fourth through pattern 216 in the second area AR2, extend to the second n-type semiconductor layer 202 and surround an upper portion of the outer sidewall of the fifth through pattern 218 in the third area AR3.

In the fourth area AR4, the third electrode pad EL3 may be brought into electrical contact directly with the third n-type semiconductor layer 302, without forming a through pattern or a coupling pattern on the third n-type semiconductor layer 302 of the third light emitting part LE3.

In this manner, by the plurality of through patterns 112, 114, 214, 216, 218, 310, 320, 322, and 324, which pass through the first light emitting part LE1, the second light emitting part LE2, and the third light emitting part LE3, and the coupling patterns 116, 118, 210, 312, 314, and 316, which pass through the first adhesion layer AD1, the second adhesion layer AD2, and the third adhesion layer AD3 and have electrical conductivities, the common electrode pad CEL, the first electrode pad EL1, the second electrode pad EL2, and the third electrode pad EL3 may be coupled to the first light emitting part LE1, the second light emitting part LE2, and the third light emitting part LE3, which are vertically stacked. In this manner, since the common electrode pad CEL, the first electrode pad EL1, the second electrode pad EL2, and the third electrode pad EL3 of a light emitting device are coupled to the first light emitting part LE1, the second light emitting part LE2, and the third light emitting part LE3, without etching every light emitting parts to form through patterns therein, the light emitting area of the light emitting device according to the illustrated exemplary embodiment may be formed larger. Moreover, as compared to a case where through via patterns, which vertically pass through the first light emitting part LE1, the second light emitting part LE2, and the third light emitting part LE3, and the common electrode pad CEL, the first electrode pad EL1, the second electrode pad EL2, and the third electrode pad EL3 are coupled to the first light emitting part LE1, the second light emitting part LE2, and the third light emitting part LE3, the degree of difficulty in processing the light emitting device, for example, the degree of difficulty in an etching process for forming contact vias and the degree of difficulty in a deposition process for filling contact vias due to a large aspect ratio of etched contact vias, may be reduced, and thus, the manufacture of the light emitting device according to the illustrated exemplary embodiment may be facilitated.

Figure 2:
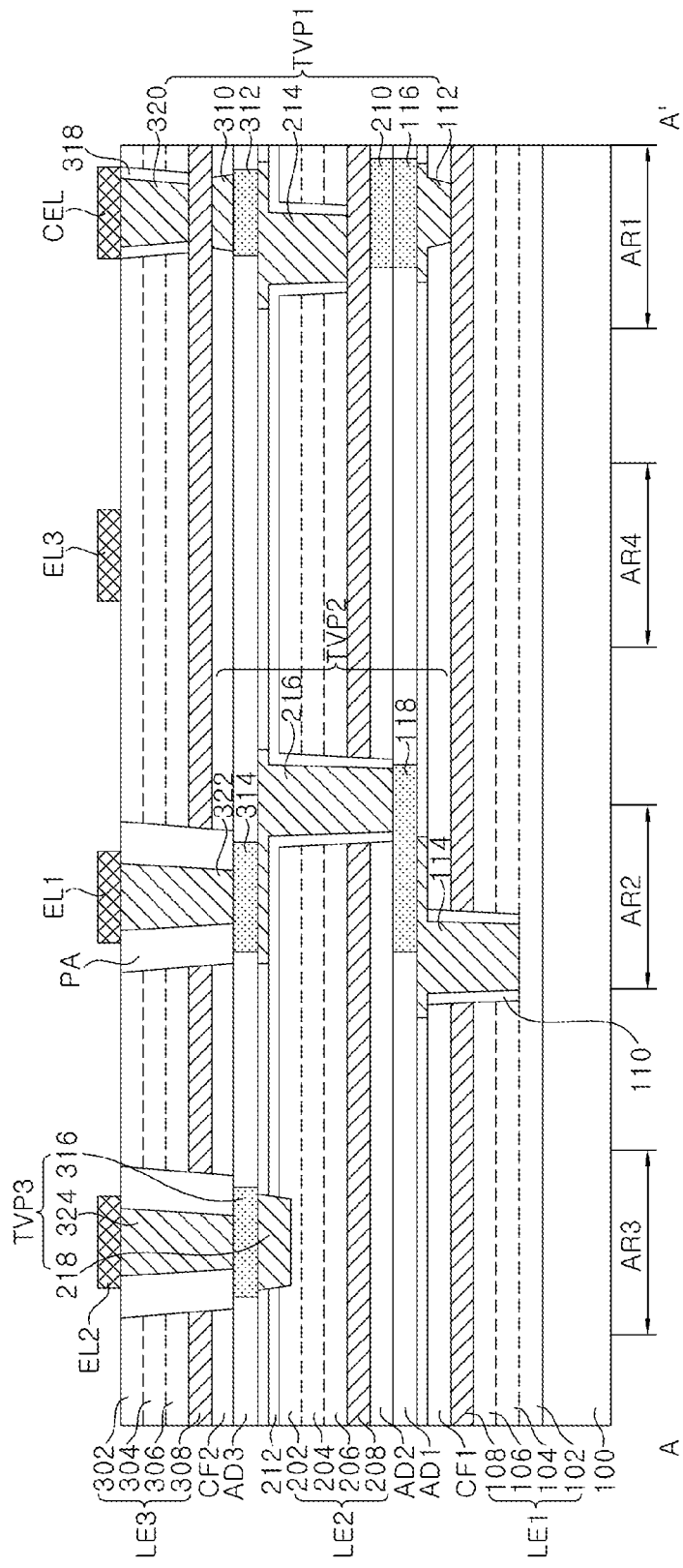
FIG. 2 is a cross-sectional view of a light emitting device according to another exemplary embodiment.

FIG. 2 is a cross-sectional view of a light emitting device according to another exemplary embodiment.

Referring to FIG. 2, a light emitting device may include a first light emitting part LE1, a second light emitting part LE2, and a third light emitting part LE3, which are vertically stacked.

The first light emitting part LE1 may include a first n-type semiconductor layer 102, a first active layer 104, a first p-type semiconductor layer 106, and a first transparent electrode 108, which are vertically stacked. The second light emitting part LE2 may include a second transparent electrode 208, a second p-type semiconductor layer 206, a second active layer 204, and a second n-type semiconductor layer 202, which are sequentially stacked. The third light emitting part LE3 may include a third transparent electrode 308, a third p-type semiconductor layer 306, a third active layer 304, and a third n-type semiconductor layer 302, which are sequentially stacked.

The light emitting device may further include a common electrode pad CEL, which is electrically coupled with the first p-type semiconductor layer 106 of the first light emitting part LE1, the second p-type semiconductor layer 206 of the second light emitting part LE2, and the third p-type semiconductor layer 306 of the third light emitting part LE3 in a first area AR1, a first electrode pad EL1 which is electrically coupled with the first n-type semiconductor layer 102 of the first light emitting part LE1 in a second area AR2, a second electrode pad EL2 which is electrically coupled with the second n-type semiconductor layer 202 of the second light emitting part LE2 in a third area AR3, and a third electrode pad EL3 which is electrically coupled with the third n-type semiconductor layer 302 of the third light emitting part LE3 in a fourth area AR4.

The light emitting device may further include a first color filter CF1 and a first adhesion layer AD1, which are disposed between the first light emitting part LE1 and the second light emitting part LE2, and a second color filter CF2 and a second adhesion layer AD2, which are disposed between the second light emitting part LE2 and the third light emitting part LE3.

The light emitting device may further include a first through structure TVP1, which includes a first through pattern 112, a first coupling pattern 116, a third coupling pattern 210, a third through pattern 214, a fourth coupling pattern 312, a sixth through pattern 310, and a seventh through pattern 320 in the first area AR1, a second through structure TVP2 which includes a second through pattern 114, a second coupling pattern 118, a fourth through pattern 216, a fifth coupling pattern 314, and an eighth through pattern 322 in the second area AR2, and a third through structure TVP3 which includes a fifth through pattern 218, a sixth coupling pattern 316 and a ninth through pattern 324 in the third area AR3. The light emitting device may further include a first insulation layer 110, a second insulation layer 212, and a third insulation layer 318.

The first through pattern 112 of the first through structure TVP1 may include a first portion which is disposed in the first color filter CF1, and a second portion which has a width greater than the first portion and extends onto the first color filter CF1. By the second portion of the first through pattern 112, a margin for aligning the first coupling pattern 116 with the first through pattern 112 may be increased.

The third through pattern 214 of the first through structure TVP1 may include a first portion which is disposed in the second p-type semiconductor layer 206, the second active layer 204, the second n-type semiconductor layer 202, and the second insulation layer 212, and a second portion which has a width greater than the first portion and extends onto the second insulation layer 212. By the second portion of the third through pattern 214, a margin for aligning the fourth coupling pattern 312 with the third through pattern 214 may be increased.

Further, a vertical central axis crossing a center of the first through pattern 112 may be laterally spaced apart from a vertical central axis crossing a center of the third through pattern 214. A vertical central axis crossing a center of the sixth or seventh through pattern 310 or 312 may be laterally spaced apart from the vertical central axis crossing a center of the third through pattern 214. The vertical central axis crossing the center of the sixth or seventh through pattern 310 or 312 may be consistent with or laterally spaced apart from the vertical central axis crossing the center of the first through pattern 112.

The second through pattern 114 of the second through structure TVP2 may include a first portion which is disposed in the first active layer 104, the first p-type semiconductor layer 106, the first transparent electrode 108, and the first color filter CF1, and a second portion which has a width greater than the first portion and extends onto the first color filter CF1. By the second portion of the second through pattern 114, a margin for aligning the second coupling pattern 118 with the second through pattern 114 may be increased. The second coupling pattern 118 may be in contact with the second portion of the second through pattern 114 and be extended toward an outside of the second portion.

The fourth through pattern 216 of the second through structure TVP2 may include a first portion which is disposed in the second adhesion layer AD2, the second transparent electrode 208, the second p-type semiconductor layer 206, the second active layer 204, the second n-type semiconductor layer 202, and the second insulation layer 212, and a second portion which has a width greater than the first portion and extends onto the second insulation layer 212. By the second portion of the fourth through pattern 216, a margin for aligning the fifth coupling pattern 314 with the fourth through pattern 216 may be increased.

As shown in FIG. 2, the first portion of the fourth through pattern 216 may be spaced apart from the first portion of the second through pattern 114. The first portion of the fourth through pattern 216 may be electrically connected to the extension of the second coupling pattern 118. Accordingly, a vertical central axis crossing a center of the second through pattern 114 may be laterally spaced apart from a vertical central axis crossing a center of the fourth through pattern 216. A vertical central axis crossing a center of the eighth through pattern 322 may be consistent with or laterally spaced apart from a vertical central axis crossing the center of the second through pattern 114.

In some exemplary embodiments, each of the fifth through pattern 218 and the sixth through pattern 310 may have an upper portion and lower portion which has a greater width, and thus, a coupling margin for a coupling pattern to be stacked on the upper portion may be increased.

Since the light emitting device of FIG. 2 includes components substantially the same as those of the light emitting device shown in FIGS. 1A to 1D, repeated descriptions thereof will be omitted.

Figure 3:
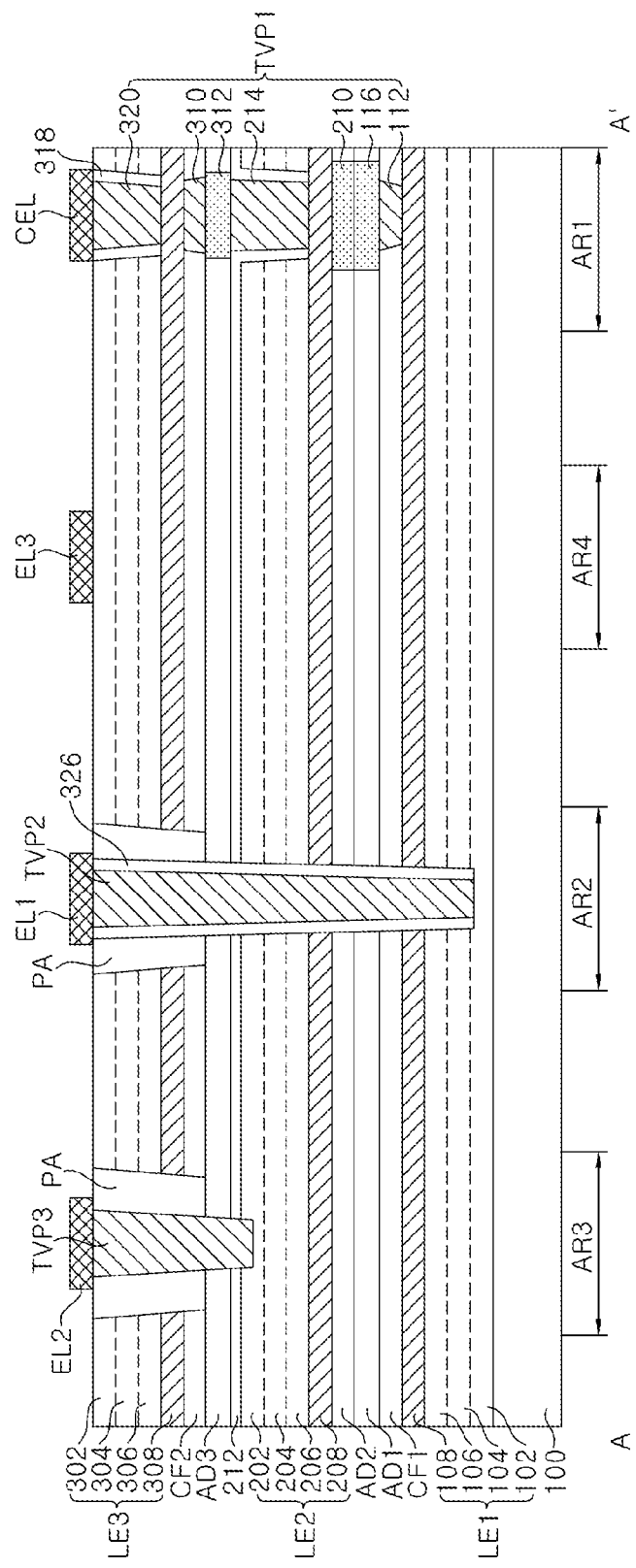
FIG. 3 is a cross-sectional view of a light emitting device according to still another exemplary embodiment.

FIG. 3 is a cross-sectional view of a light emitting device according to yet another exemplary embodiment.

Referring to FIG. 3, a light emitting device may include a first light emitting part LE1, a second light emitting part LE2, and a third light emitting part LE3, which are vertically stacked.

The first light emitting part LE1 may include a first n-type semiconductor layer 102, a first active layer 104, a first p-type semiconductor layer 106, and a first transparent electrode 108, which are vertically stacked. The second light emitting part LE2 may include a second transparent electrode 208, a second p-type semiconductor layer 206, a second active layer 204, and a second n-type semiconductor layer 202, which are sequentially stacked. The third light emitting part LE3 may include a third transparent electrode 308, a third p-type semiconductor layer 306, a third active layer 304, and a third n-type semiconductor layer 302, which are sequentially stacked.

The light emitting device may further include a common electrode pad CEL which is electrically coupled with the first p-type semiconductor layer 106 of the first light emitting part LE1, the second p-type semiconductor layer 206 of the second light emitting part LE2, and the third p-type semiconductor layer 306 of the third light emitting part LE3 in a first area AR1, a first electrode pad EL1 which is electrically coupled with the first n-type semiconductor layer 102 of the first light emitting part LE1 in a second area AR2, a second electrode pad EL2 which is electrically coupled with the second n-type semiconductor layer 202 of the second light emitting part LE2 in a third area AR3, and a third electrode pad EL3 which is electrically coupled with the third n-type semiconductor layer 302 of the third light emitting part LE3 in a fourth area AR4.

The light emitting device may further include a first color filter CF1 and a first adhesion layer AD1, which are disposed between the first light emitting part LE1 and the second light emitting part LE2, and a second color filter CF2 and a second adhesion layer AD2, which are disposed between the second light emitting part LE2 and the third light emitting part LE3.

The light emitting device may further include a first through structure TVP1 which includes a first through pattern 112, a first coupling pattern 116, a third coupling pattern 210, a third through pattern 214, a fourth coupling pattern 312, a sixth through pattern 310, and a seventh through pattern 320 in the first area AR1, a second through structure TVP2 which electrically couples the first n-type semiconductor layer 102 and the first electrode pad EL1 in the second area AR2, and a third through structure TVP3 which electrically couples the second n-type semiconductor layer 202 and the second electrode pad EL2 in the third area AR3.

The light emitting device may further include a second insulation layer 212, a third insulation layer 318, and a fourth insulation layer 326.

The second insulation layer 212 may surround the outer sidewall of the third through pattern 214 and extend onto the second n-type semiconductor layer 202. The third insulation layer 318 may surround the outer sidewall of the seventh through pattern 320. The fourth insulation layer 326 may surround the outer sidewall of the second through structure TVP2. The fourth insulation layer 326 may insulate the first active layer 104, the first p-type semiconductor layer 106, the first transparent electrode 108, the second transparent electrode 208, the second p-type semiconductor layer 206, the second active layer 204, and the second n-type semiconductor layer 202 from the second through structure TVP2.

Since the first through structure TVP1 electrically couples one surfaces and the other surfaces of the first transparent electrode 108, the second transparent electrode 208, and the third transparent electrode 308 through the plurality of through patterns 112, 214, 310, and 320, and the plurality of coupling patterns 116, 210 and 312, without etching the first transparent electrode 108, the second transparent electrode 208, and the third transparent electrode 308, areas through which the first transparent electrode 108, the second transparent electrode 208, and the third transparent electrode 308 are brought into contact with the through patterns 112, 214, 310, and 320 and the coupling patterns 116, 210, and 312 may be increased, whereby electrical resistance may be reduced. On the other hand, since the second through structure TVP2 and the third through structure TVP3 directly couple the first n-type semiconductor layer 102 with the first electrode pad EL1 and the second n-type semiconductor layer 202 with the second electrode pad EL2 without using through patterns and coupling patterns, manufacturing processes may be simplified.

Since the light emitting device of FIG. 3 includes components substantially the same as those of the light emitting device shown in FIGS. 1A to 1D, repeated descriptions thereof will be omitted.

FIGS. 4 to 19 are cross-sectional views illustrating a method for manufacturing a light emitting device according to an exemplary embodiment. Hereinafter, the manufacturing method will be exemplarily described with reference to the light emitting device of FIGS. 1A and 1C, however, the inventive concepts are not limited thereto.

Figure 4:
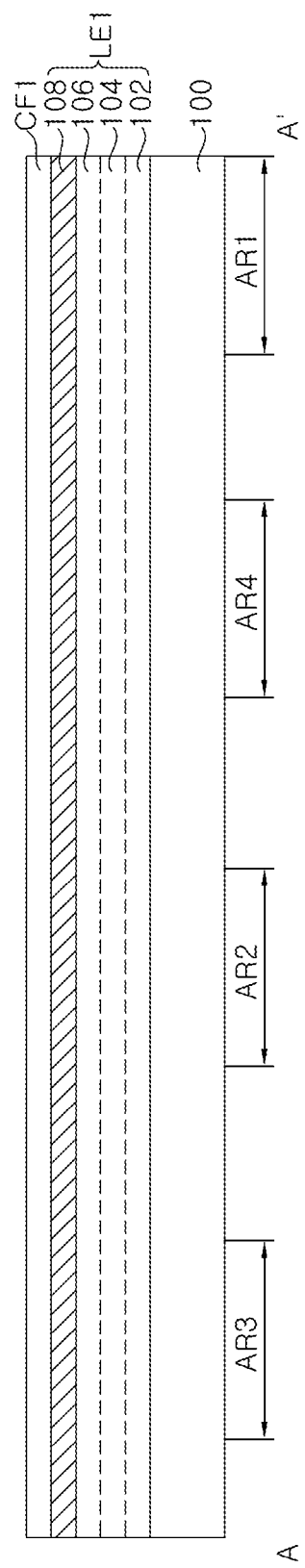
FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, and FIG. 19 are cross-sectional views illustrating a method for manufacturing a light emitting device according to an exemplary embodiment.

Referring to FIG. 4, a first n-type semiconductor layer 102, a first active layer 104, a first p-type semiconductor layer 106, and a first transparent electrode 108 may be sequentially formed on a substrate 100 to form a first light emitting part LE1. A first color filter CF1 may be formed on the first light emitting part LE1.

The substrate 100 may include a first area AR1, a second area AR2, a third area AR3, and a fourth area AR4. For example, the substrate 100 may have a substantially quadrangular structure when viewed from the top, and the first area AR1, the second area AR2, the third area AR3, and the fourth area AR4 may respectively correspond to the corner portions of the substrate 100.

The first n-type semiconductor layer 102, the first active layer 104, and the first p-type semiconductor layer 106 may be sequentially grown on the substrate 100 through a process, such as metal organic chemical vapor deposition (MOCVD) or molecular beam epitaxy (MBE). Then, the first transparent electrode 108 may be formed on the first p-type semiconductor layer 106 by using chemical vapor deposition (CVD) or the like. The first color filter CF1 may be formed on the first transparent electrode 108 by using CVD, for example.

Figure 5:
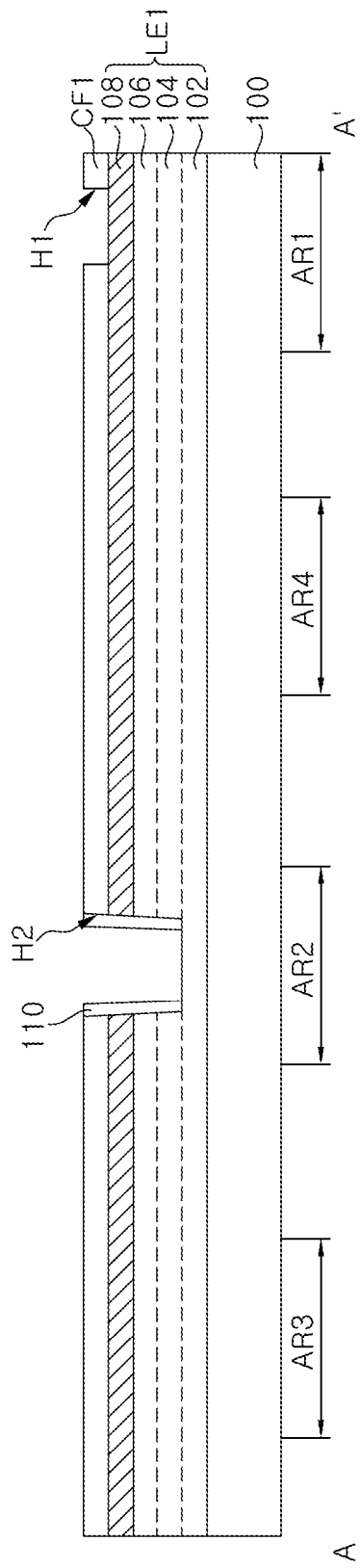

Referring to FIG. 5, by etching the first color filter CF1 and the first light emitting part LE1, a first hole H1 may be formed in the first area AR1 and a second hole H2 may be formed in the second area AR2. The first hole H1 may expose the first transparent electrode 108, and the second hole H2 may expose the first n-type semiconductor layer 102.

Then, a pre-first insulation layer may be conformally formed on the first color filter CF1 formed with the first hole H1 and the second hole H2, continuously along the surfaces of the first color filter CF1 and the first light emitting part LE1, while not completely filling the first hole H1 and the second hole H2. By etching the pre-first insulation layer, a first insulation layer 110 disposed on the inner sidewall of the first hole H1 may be formed.

In some exemplary embodiments, the first insulation layer 110 may also be formed on the inner sidewall of the first hole H1. However, when the first color filter CF1 includes an insulating material, the first insulation layer 110 may or may not be formed in the first hole H1.

Figure 6:
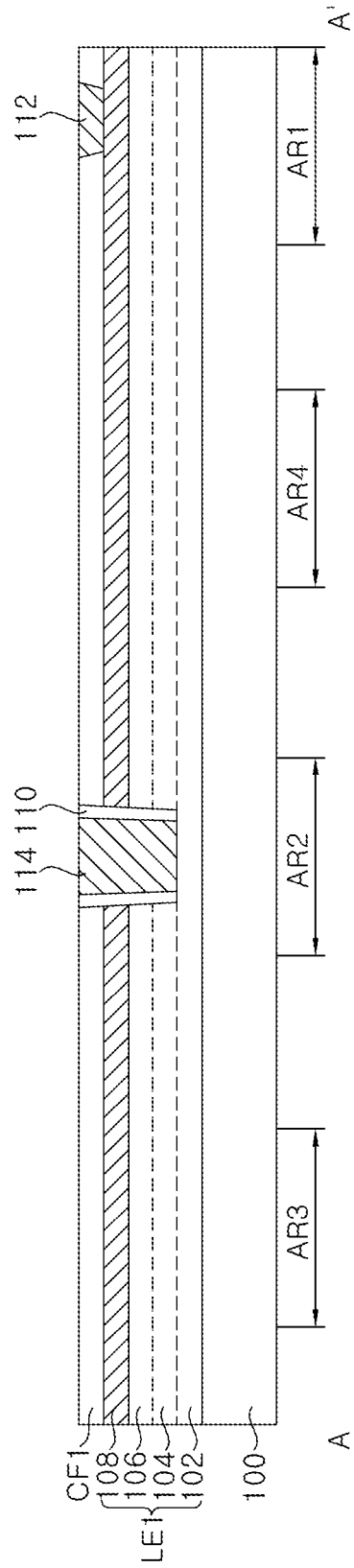

Referring to FIG. 6, a first through pattern 112 and a second through pattern 114, which fill the first hole H1 and the second hole H2, respectively, may be formed.

In particular, a first conductive layer may be formed on the first insulation layer 110, the first color filter CF1, and the first light emitting part LE1, which are formed with the first hole H1 and the second hole H2, to substantially fill the first hole H1 and the second hole H2. The first conductive layer may include at least one of Ti, Ni, Au, Cr, Cu, TiW, or Mo.

By etching the first conductive layer, such that the surface of the first color filter CF1 is exposed, the first through pattern 112 substantially filling (or burying) the first hole H1 and the second through pattern 114 substantially filling the second hole H2 may be formed. The first through pattern 112 may be formed in the first area AR1, and the second through pattern 114 may be formed in the second area AR2.

Figure 7:
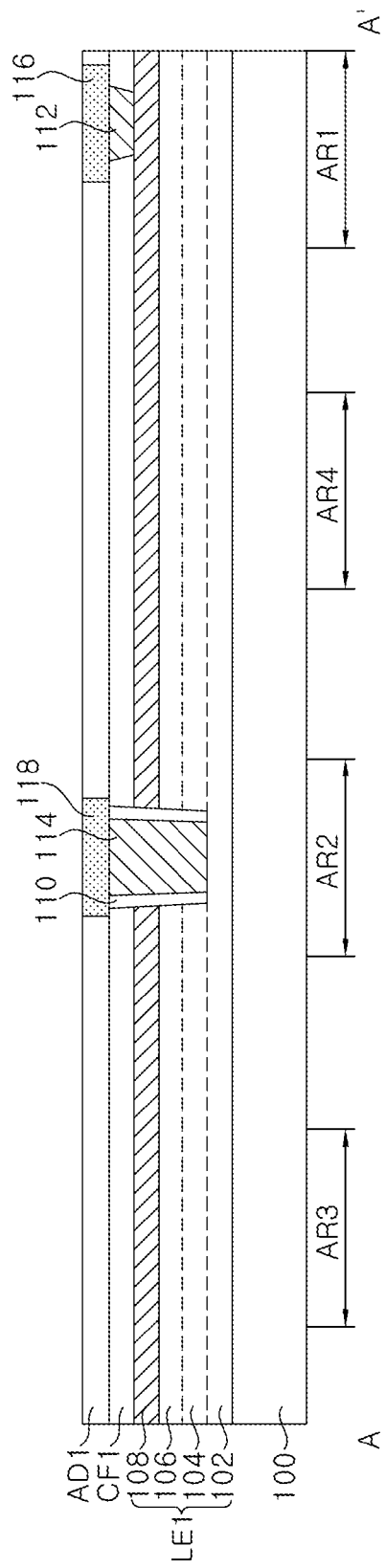

Referring to FIG. 7, a first adhesion layer AD1 including a first coupling pattern 116 aligned with the first through pattern 112 and a second coupling pattern 118 aligned with the second through pattern 114 may be formed.

In particular, a pre-first adhesion layer may be formed on the first color filter CF1 formed with the first through pattern 112 and the second through pattern 114. The pre-first adhesion layer may be formed by using a spin coating process, for example, which may include SOG (spin on glass), epoxy, polyimide, SUB, BCB, or others. By etching the pre-first adhesion layer, the first adhesion layer AD1 having a first opening exposing the first through pattern 112 and a second opening exposing the second through pattern 114 may be formed. A second conductive layer may be formed on the first adhesion layer AD1. The second conductive layer may include a metallic material having a low melting temperature, an adhesion property, and an electrical conductivity, for example, such Sn or In. By etching the second conductive layer, such that the surface of the first adhesion layer AD1 is exposed, the first coupling pattern 116 and the second coupling pattern 118 may be respectively formed. The first coupling pattern 116 may be formed in the first area AR1, and the second coupling pattern 118 may be formed in the second area AR2.

Figure 8:
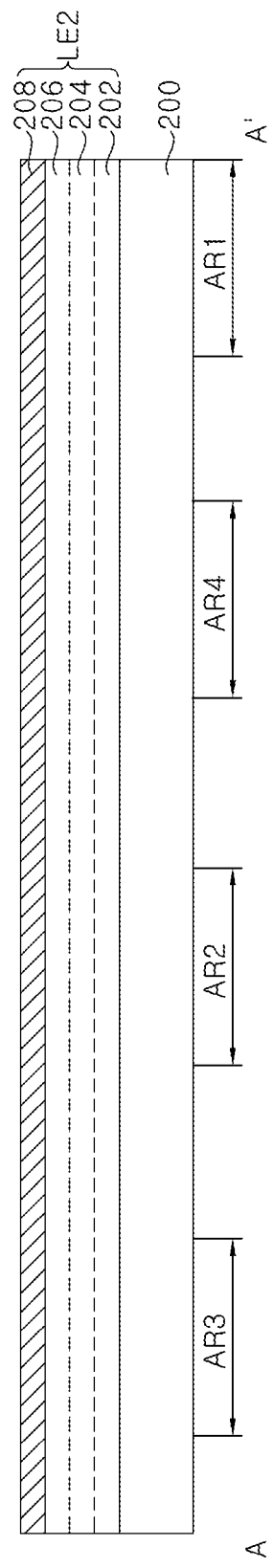

Referring to FIG. 8, a second n-type semiconductor layer 202, a second active layer 204, and a second p-type semiconductor layer 206 may be sequentially formed on a second substrate 200 by using MOCVD or MBE, and a second transparent electrode 208 may be formed on the second p-type semiconductor layer 206 by using a PVD, CVD, sol-gel, or hydrothermal synthesis method to form a second light emitting part LE2.

Figure 9:
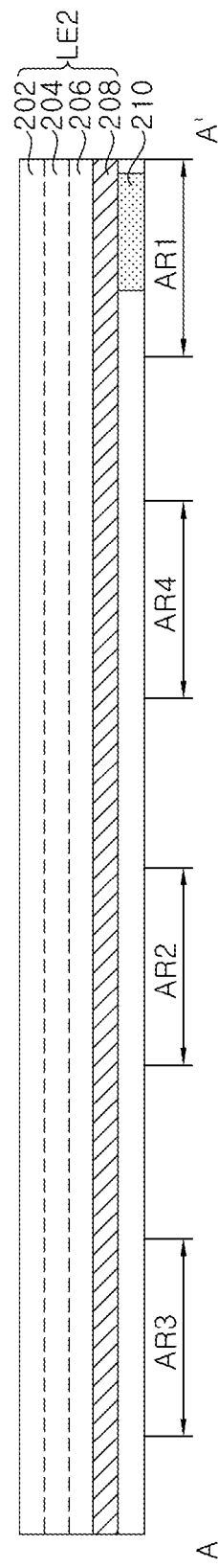

Referring to FIG. 9, a second adhesion layer AD2 including a third coupling pattern 210 may be formed on the second transparent electrode 208. In particular, a pre-second adhesion layer may be formed on the second transparent electrode 208 by using a spin coating process or the like. For example, the pre-second adhesion layer may include SOG, epoxy, polyimide, SUB, BCB, or others. By etching the pre-second adhesion layer, the second adhesion layer AD2 including a third opening may be formed. A third conductive layer may be formed on the second adhesion layer AD2 to substantially fill the third opening. The third conductive layer may include a material having low melting temperature, an adhesion property, and an electrical conductivity, for example, such as Sn or In. By etching the third conductive layer up to the exposed top surface of the second adhesion layer AD2, the third coupling pattern 210 substantially filling the third opening may be formed.

Then, the second substrate 200 may be turned over such that the second adhesion layer AD2 including the third coupling pattern 210 faces downward direction. Then, the second substrate 200 may be removed by laser lift-off or the like.

Figure 10:
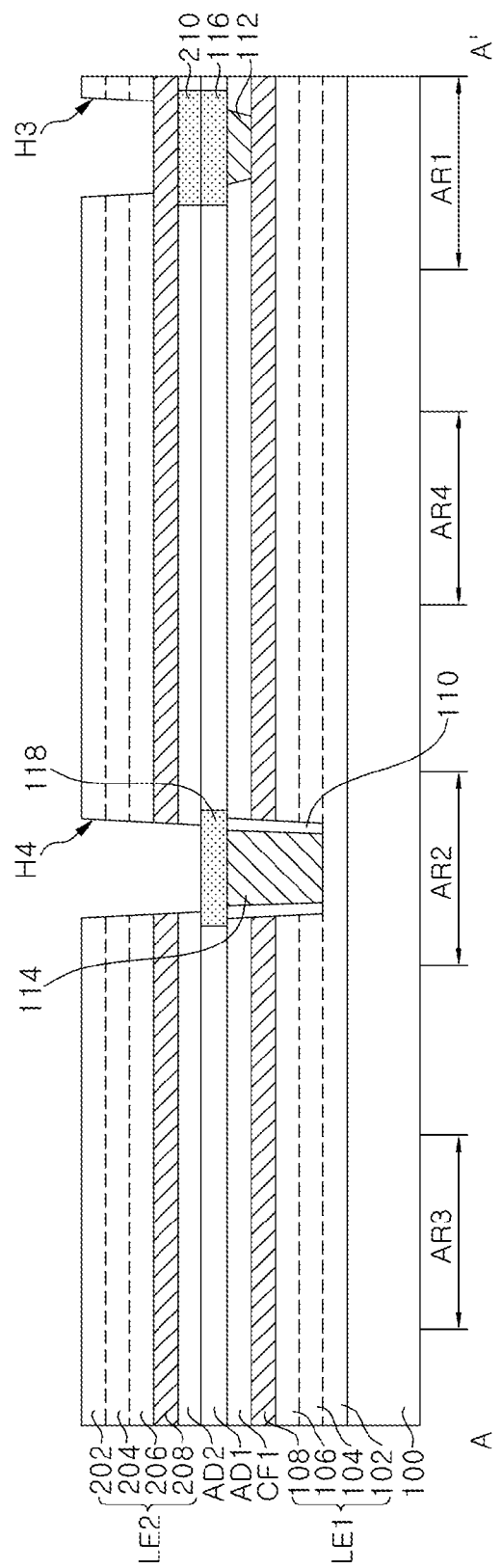

Referring to FIG. 10, by bonding the first adhesion layer AD1 formed on the first light emitting part LE1 and the second adhesion layer AD2 formed on the second light emitting part LE2, the first light emitting part LE1 and the second light emitting part LE2 may be bonded with each other. When each of the first adhesion layer AD1 and the second adhesion layer AD2 includes SOG, by performing thermo-compression after bringing the first adhesion layer AD1 and the second adhesion layer AD2 into contact with each other, the first adhesion layer AD1 and the second adhesion layer AD2 may be bonded with each other. The first coupling pattern 116 in the first area AR1 may be bonded with the third coupling pattern 210, and the second coupling pattern 118 in the second area AR2 may be bonded with the second adhesion layer AD2.

Then, a third hole H3 and a fourth hole H4 may be formed to expose the second transparent electrode 208 and the second coupling pattern 118, respectively. In particular, by etching the second n-type semiconductor layer 202, the second active layer 204, and the second p-type semiconductor layer 206 in the first area AR1, the third hole H3 which exposes the second transparent electrode 208 may be formed. By etching the second n-type semiconductor layer 202, the second active layer 204, the second p-type semiconductor layer 206, the second transparent electrode 208, and the second adhesion layer AD2 in the second area AR2, the fourth hole H4 which exposes the second coupling pattern 118 may be formed.

Figure 11:
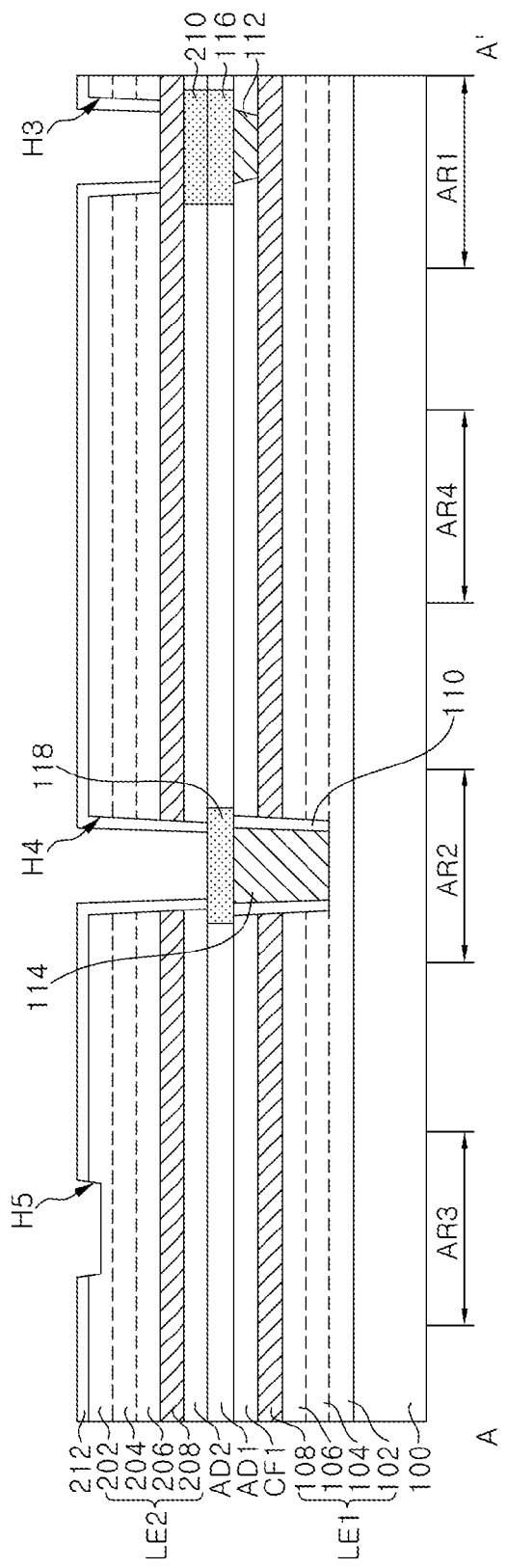

Referring to FIG. 11, a second insulation layer 212 may be formed on a top surface of the second light emitting part LE2. In this case, the second insulation layer 212 may be disposed on sidewalls that define the third hole H3 and the fourth hole H4. Then, a fifth hole H5 may be formed in the third area AR3 to expose the second n-type semiconductor layer 202.

Figure 12:
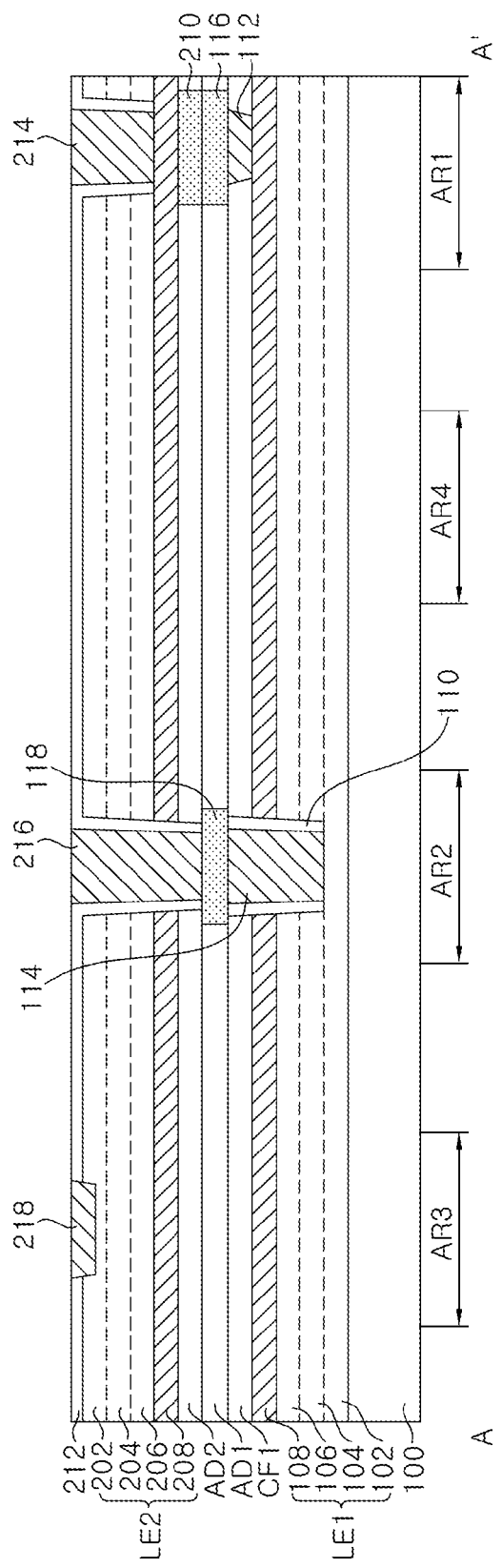

Referring to FIG. 12, a third through pattern 214, a fourth through pattern 216, and a fifth through pattern 218, which substantially fill the third hole H3, the fourth hole H4, and the fifth hole H5 may be respectively formed.

In particular, a fourth conductive layer may be formed on the second insulation layer 212 to substantially fill the third hole H3, the fourth hole H4, and the fifth hole H5. The fourth conductive layer may include at least one of Ti, Ni, Au and Cr. By etching the fourth conductive layer to expose the surface of the second insulation layer 212, the third through pattern 214 which substantially fills the third hole H3, the fourth through pattern 216 which substantially fills the fourth hole H4, and the fifth through pattern 218 which substantially fills the fifth hole H5 may be respectively formed. The third through pattern 214 may be formed in the first area AR1, the fourth through pattern 216 may be formed in the second area AR2, and the fifth through pattern 218 may be formed in the third area AR3.

Figure 13:
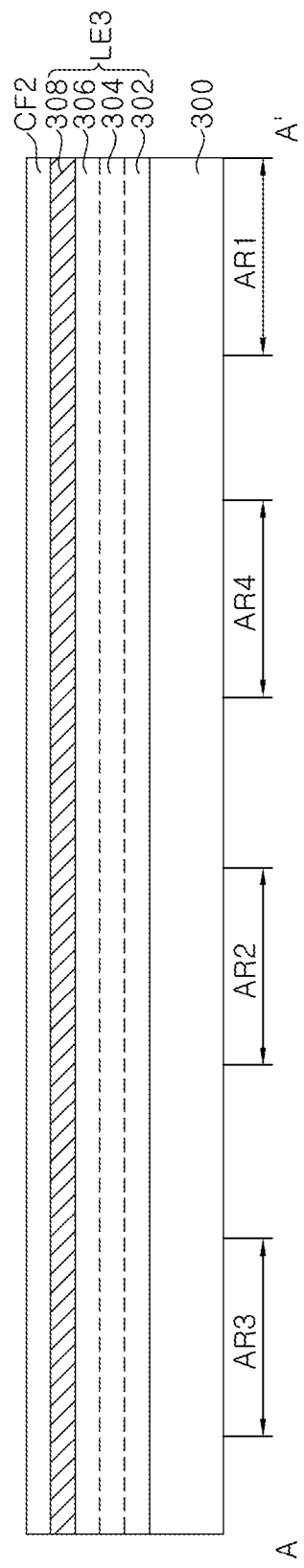

Referring to FIG. 13, a third n-type semiconductor layer 302, a third active layer 304, and a third p-type semiconductor layer 306 may be sequentially formed on a third substrate 300 by using MOCVD or MBE, and a third transparent electrode 308 may be formed on the third p-type semiconductor layer 306 by using CVD or the like to form a pre-third light emitting part. Then, a second color filter CF2 may be formed on the pre-third light emitting part.

Figure 14:
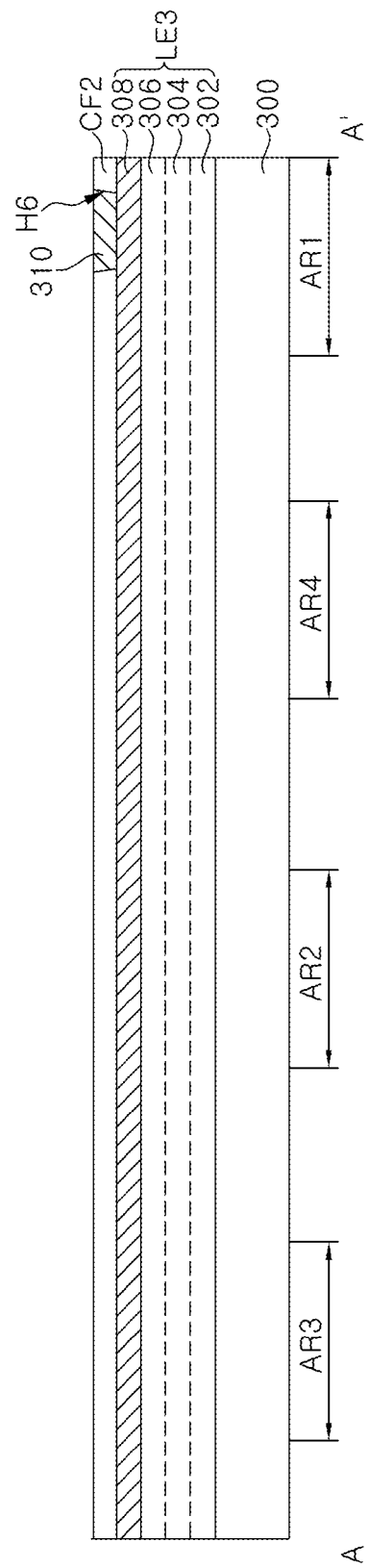

Referring to FIG. 14, the second color filter CF2 is etched to form a sixth hole H6 which exposes the third transparent electrode 308 in the first area AR1, a fifth conductive layer substantially filling the sixth hole H6 may be formed. The fifth conductive layer may include at least one of Ti, Ni, Au and Cr. By etching the fifth conductive layer to expose the surface of the second color filter CF2, a sixth through pattern 310 substantially filling the sixth hole H6 may be formed.

Figure 15:
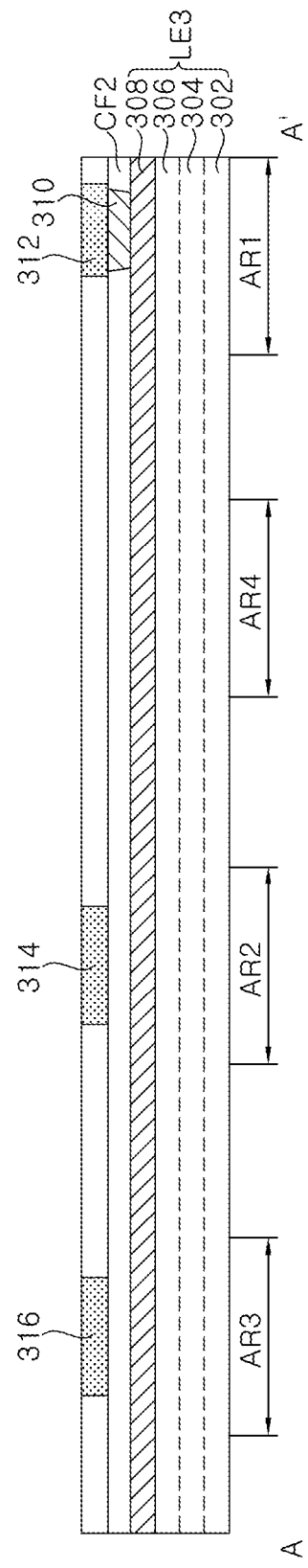

Referring to FIG. 15, a pre-third adhesion layer may be formed on the second color filter CF2, by using a spin coating process or the like. The pre-third adhesion layer may include SOG.

After forming a fourth opening exposing the sixth through pattern 310 in the first area AR1, a fifth opening exposing the second color filter CF2 in the second area AR2, and a sixth opening exposing the second color filter CF2 in the third area AR3, by etching the pre-third adhesion layer, a sixth conductive layer may be formed on the second color filter CF2 to substantially fill the fourth opening, the fifth opening, and the sixth opening. The sixth conductive layer may include metal having a low melting temperature, such as Sn or In.

By etching the sixth conductive layer to expose the second color filter CF2, a fourth coupling pattern 312 substantially filling the fourth opening, a fifth coupling pattern 314 substantially filling the fifth opening, and a sixth coupling pattern 316 substantially filling the sixth opening may be respectively formed. The fourth coupling pattern 312 may be formed in the first area AR1, the fifth coupling pattern 314 may be formed in the second area AR2, and the sixth coupling pattern 316 may be formed in the third area AR3.

The third substrate 300 may be removed through a laser lift-off process or the like. Then, the third light emitting part LE3 may be turned over, such that the third adhesion layer AD3 may face downward direction.

Figure 16:
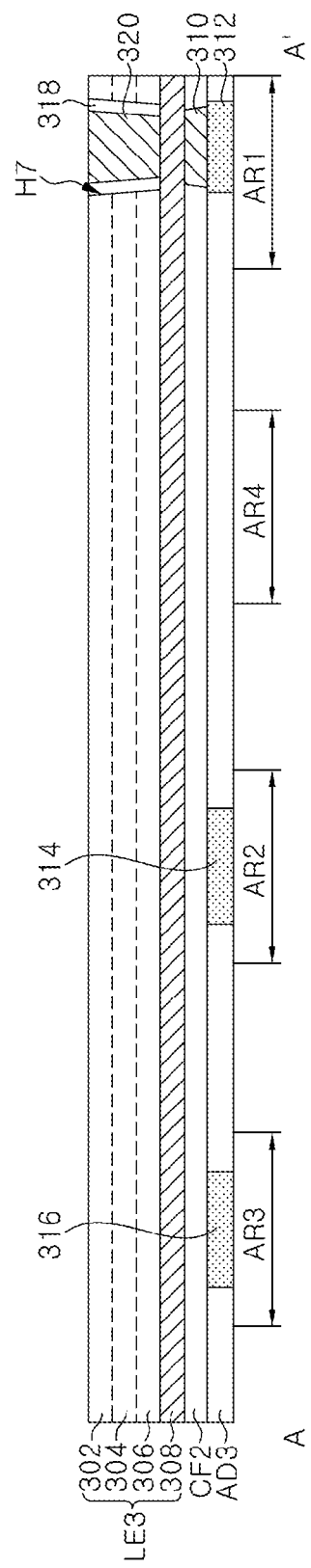

Referring to FIG. 16, a seventh hole H7 exposing the third transparent electrode 308 may be formed by etching the third n-type semiconductor layer 302, the third active layer 304, and the third p-type semiconductor layer 306 in the first area AR1. Then, a pre-third insulation layer may be conformally formed continuously along the surface of the pre-third light emitting part so as not to completely fill the seventh hole H7. By etching the pre-third insulation layer, a third insulation layer 318 disposed on the inner sidewall of the seventh hole H7 may be formed.

A seventh conductive layer may be formed on the third n-type semiconductor layer 302 to substantially fill the seventh hole H7 formed in the third insulation layer 318. The seventh conductive layer may include at least one of Ti, Ni, Au, and Cr. By etching the seventh conductive layer to expose the surface of the third n-type semiconductor layer 302, a seventh through pattern 320 substantially filling the seventh hole H7 may be formed.

Figure 17:
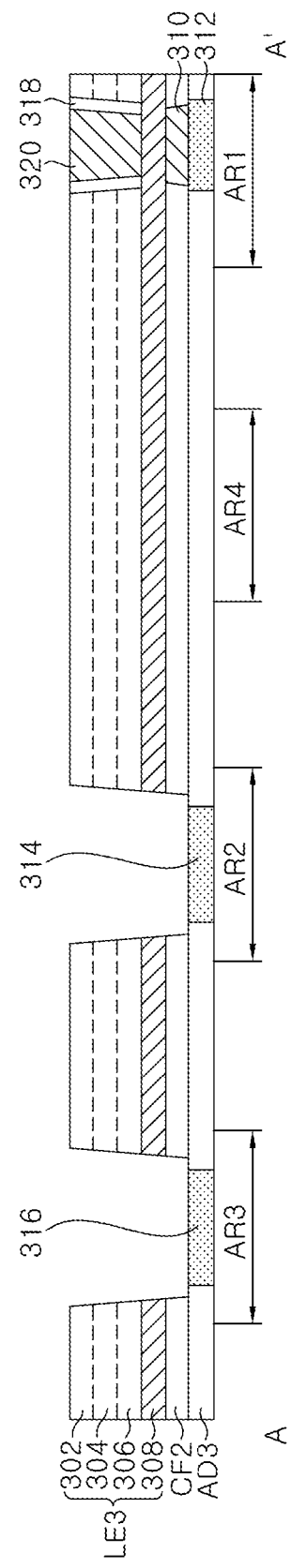

Referring to FIG. 17, by etching the pre-third light emitting part, a third light emitting part LE3 having a mesa structure may be formed. By removing the corners, which are respectively positioned in the second area AR2 and the third area AR3, the third light emitting part LE3 including a mesa structure that exposes the fifth coupling pattern 314 and the sixth coupling pattern 316 may be formed.

Figure 18:
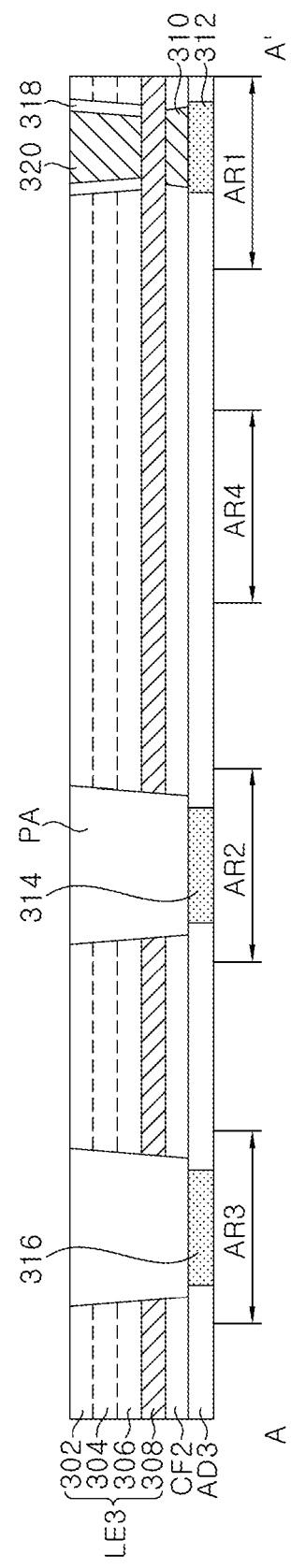

Referring to FIG. 18, a passivation layer PA, which covers the fifth coupling pattern 314 and the sixth coupling pattern 316, may be formed on the third adhesion layer AD3 and the third light emitting part LE3. The passivation layer PA may be etched to expose the surface of the third light emitting part LE3.

Figure 19:
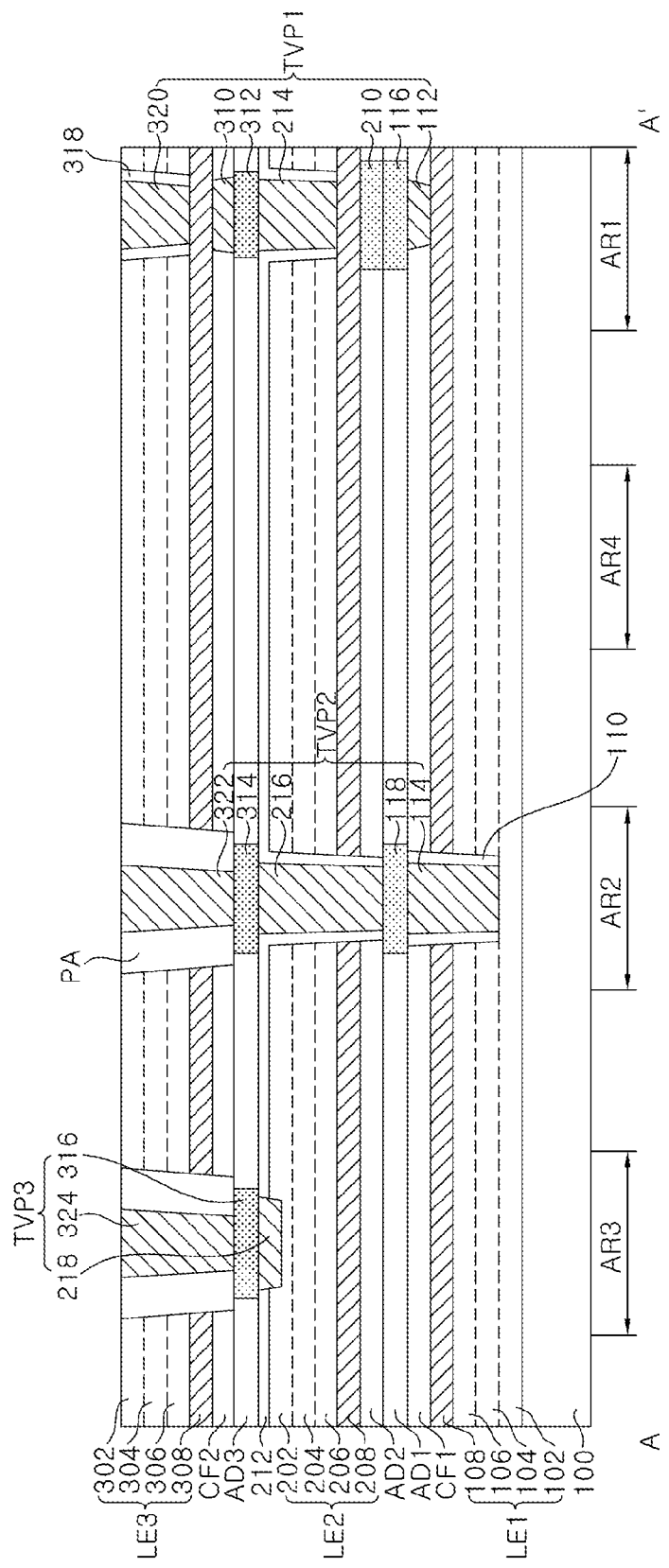

Referring to FIG. 19, an eighth hole exposing the fifth coupling pattern 314 and a ninth hole exposing the sixth coupling pattern 316 may be formed by etching the passivation layer PA. Then, an eighth conductive layer may be formed on the passivation layer PA to substantially fill the eight hole and the ninth hole. The eighth conductive layer may include at least one of Ti, Ni, Au, and Cr. By etching the eighth conductive layer to expose the surface of the passivation layer PA, an eighth through pattern 322 substantially filling the eighth hole and a ninth through pattern 324 substantially filling the ninth hole H9 may be respectively formed. The eighth through pattern 322 may be formed in the second area AR2, and the ninth through pattern 324 may be formed in the third area AR3.

Then, the third light emitting part LE3 may be bonded to a structure, in which the first light emitting part LE1 and the second light emitting part LE2 are bonded with each other, by using the third adhesion layer AD3. The third adhesion layer AD3 may include SOG and be bonded with the second insulation layer 212 through a thermo-compression process. The fourth coupling pattern 312 may be aligned with the third through pattern 214, the fifth coupling pattern 314 may be aligned with the fourth through pattern 216, and the sixth coupling pattern 316 may be aligned with the fifth through pattern 218.

In this manner, a first through structure TVP1 which includes the first through pattern 112, the first coupling pattern 116, the third coupling pattern 210, the third through pattern 214, the fourth coupling pattern 312, the sixth through pattern 310, and the seventh through pattern 320, a second through structure TVP2 which includes the second through pattern 114, the second coupling pattern 118, the fourth through pattern 216, the fifth coupling pattern 314, and the eighth through pattern 322, and a third through structure TVP3 which includes the fifth through pattern 218, the sixth coupling pattern 316, and the ninth through pattern 324 may be respectively formed. The first through structure TVP1 may be formed in the first area AR1, the second through structure TVP2 may be formed in the second area AR2, and the third through structure TVP3 may be formed in the third area AR3.

Referring back to FIG. 1B, a common electrode pad CEL which is brought into electrical contact with the first through structure TVP1 in the first area AR1, a first electrode pad EL1 which is brought into electrical contact with the second through structure TVP2 in the second area AR2, a second electrode pad EL2 which is brought into electrical contact with the third through structure TVP3 in the third area AR3, and a third electrode pad EL3 which is brought into electrical contact with the third n-type semiconductor layer 302 in the fourth area AR4 may be respectively formed.

According to the exemplary embodiments, a light emitting device may include through patterns that pass through a first light emitting part, a second light emitting part, and a third light emitting part, and coupling patterns disposed in a first adhesion layer and a second adhesion layer that electrically couple the first to third light emitting parts with a common electrode pad, a first electrode pad, a second electrode pad, and a third electrode pad. In this manner, a wider light emitting area may be obtained as compared to when each of the first to third light emitting parts is formed to include a mesa structure. Also, as compared to a case where the first to third light emitting parts are electrically coupled straight to the command electrode pad, the first electrode pad, the second electrode pad, and the third electrode pad without using the through patterns and the coupling patterns, the degree of difficulty in manufacturing process may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a substrate;
a light emitter disposed on the substrate and including a first conductivity-type semiconductor layer, an active layer, a second conductivity-type semiconductor layer, and a first electrode;
a common electrode pad electrically connected to the light emitter;
a first electrode pad electrically connected to the light emitter; and
a second electrode pad disposed on the light emitter,
wherein the common electrode pad includes a plurality of metal layers,
wherein the substrate has substantially a quadrangular shape when viewed from the top, and has first, second, third, and fourth corners, and
wherein the first electrode pad and the second electrode pad are disposed adjacent to the first and second corners, respectively, are closer to each respective one of the first and second corners than to a center of the substrate when viewed from the top, and a distance between the first electrode pad and the second electrode pad is greater than a width of the first electrode pad or the second electrode pad.

2. The light emitting device of claim 1, wherein the light emitter comprises a first light emitter, a second light emitter disposed over the first light emitter, and a third light emitter disposed over the second light emitter.

3. The light emitting device of claim 2, wherein:
the first electrode pad is electrically connected to a first conductivity-type semiconductor layer of the first light emitter;

the second electrode pad is electrically connected to a first conductivity-type semiconductor layer of the third light emitter; and the common electrode pad is electrically connected to second conductivity-type semiconductor layers of the first and third light emitters.

4. The light emitting device of claim 3, further comprising a third electrode pad electrically connected to a first conductivity-type semiconductor layer of the second light emitter.

5. The light emitting device of claim 4, wherein the common electrode pad is electrically connected to a second conductivity-type semiconductor layer of the second light emitter.

6. The light emitting device of claim 4, wherein the third electrode pad and the common electrode pad are respectively disposed adjacent to third and fourth corners of the substrate.

7. The light emitting device of claim 6, wherein the first corner is adjacent to the second corner and the third corner.

8. The light emitting device of claim 2, wherein an opening is formed in each of the first, second, and third light emitters through which the first electrode pad passes through.

9. The light emitting device of claim 8, wherein an opening of the third light emitter has a greater width than the openings of the first and second light emitters.

10. The light emitting device of claim 2, further comprising:
    a first adhesive layer disposed between the first light emitter and the second light emitter, the first adhesive layer including first coupling patterns that have an adhesion property and an electrical conductivity; and
    a second adhesive layer disposed between the second light emitter and the third light emitter, the second adhesive layer including second coupling patterns that have an adhesion property and an electrical conductivity.

11. The light emitting device of claim 10, wherein the first adhesive layer has a greater height than the second adhesive layer.

12. The light emitting device of claim 2, further comprising:
    a first color filter disposed between the first light emitter and the second light emitter; and
    a second color filter disposed between the second light emitter and the third light emitter.

13. The light emitting device of claim 1, wherein a length between first and third corners of the light emitter is less than a length between the second and fourth corners of the light emitting device.

14. The light emitting device of claim 1, wherein the common electrode pad, the first electrode pad, and the second electrode pad have different heights, and are disposed on a same plane.

15. The light emitting device of claim 1, wherein the first electrode is transparent.

16. The light emitting device of claim 1, wherein at least one of the common electrode pad, the first electrode pad, and the second electrode pad is surrounded by an insulation layer.

17. The light emitting device of claim 1, wherein:
    the common electrode pad and the first electrode pad are surrounded by an insulation layer; and
    the insulation layer surrounding the first electrode pad has a greater thickness than the insulation layer surrounding the common electrode pad.

18. The light emitting device of claim 1, wherein the first corner and the third corner are diagonally disposed with respect to one side of the light emitting device.

19. The light emitting device of claim 1, wherein light emitted from the light emitter is configured to be extracted through the substrate.

20. The light emitting device of claim 1, wherein at least a portion of the light emitter includes a mesa.

* * * * *